United States Patent [19]

Reardon, Jr.

[11] 4,343,885

[45] Aug. 10, 1982

[54] PHOTOTROPIC PHOTOSENSITIVE COMPOSITIONS CONTAINING FLUORAN COLORFORMER

[75] Inventor: Edward J. Reardon, Jr., El Toro, Calif.

[73] Assignee: Dynachem Corporation, Tustin, Calif.

[21] Appl. No.: 195,285

[22] Filed: Oct. 8, 1980

Related U.S. Application Data

[63] Continuation of Ser. No. 97,096, Nov. 23, 1979, abandoned, which is a continuation of Ser. No. 904,145, May 9, 1978, abandoned.

[51] Int. Cl.$^3$ .......................... G03C 1/52; G03C 1/68
[52] U.S. Cl. ..................................... 430/177; 430/270; 430/281; 430/286; 430/275; 430/344; 430/338; 430/332
[58] Field of Search ............... 430/281, 292, 916, 344, 430/171, 176, 177, 541, 286, 287, 275, 285, 961, 270, 338, 913; 106/21

[56] References Cited

U.S. PATENT DOCUMENTS

| | | | |
|---|---|---|---|
| 3,140,947 | 7/1964 | Foris | 430/332 |
| 3,445,232 | 5/1969 | Shirey | 430/344 |
| 3,501,331 | 3/1970 | Kimura et al. | 428/320.6 |
| 3,514,310 | 5/1970 | Kimura et al. | 428/320.6 |
| 3,525,616 | 8/1970 | Hackmann et al. | 430/270 |
| 3,527,639 | 9/1970 | Moraw | 430/344 |
| 3,637,390 | 1/1972 | Peterson | 430/344 |
| 3,650,754 | 3/1972 | Jones | 430/270 |
| 3,767,408 | 10/1973 | Harrison et al. | 430/343 |
| 3,769,023 | 10/1973 | Lewis et al. | 430/282 |
| 3,929,831 | 12/1975 | Garner et al. | 260/326.34 |
| 4,007,195 | 2/1977 | Garner et al. | 260/293.58 |
| 4,017,313 | 4/1977 | Hartzler | 430/346 |
| 4,065,315 | 12/1977 | Yamazaki et al. | 430/369 |
| 4,097,288 | 6/1978 | Lawton | 430/913 |

FOREIGN PATENT DOCUMENTS

| | | |
|---|---|---|
| 49-23674 | 7/1974 | Japan . |
| 51-100716 | 9/1976 | Japan . |
| 1146497 | 6/1966 | United Kingdom . |
| 1269601 | 1/1970 | United Kingdom . |
| 1339316 | 8/1971 | United Kingdom . |

OTHER PUBLICATIONS

Hamb, Application Serial Number 077,379, filed Oct. 1, 1970, laid open to public inspection on Aug. 31, 1971.

*Primary Examiner*—Won H. Louie, Jr.
*Attorney, Agent, or Firm*—Gerald K. White

[57] ABSTRACT

Compositions containing a polymerizable, curable or crosslinkable component, a photoinitiator, a fluoran colorformer and a latent activator that releases or promotes the release of a Lewis acid, will become insoluble and change color under the influence of actinic radiation. These compositions are particularly useful to make dry film photoresists, which are widely used in the electronics industry to manufacture printed circuits.

46 Claims, No Drawings

PHOTOTROPIC PHOTOSENSITIVE COMPOSITIONS CONTAINING FLUORAN COLORFORMER

This application is a continuation of application Ser. No. 097,096, filed Nov. 23, 1979, and now abandoned, which in turn is a continuation of application Ser. No. 904,145, filed May 9, 1978, and now abandoned.

BACKGROUND

Two techniques widely used in the fabrication of printed circuit boards are the additive process and the subtractive process.

In the manufacture of printed circuit boards by the subtractive process, there is adhered to the surface of a copper-clad laminate one surface of a dry, photoresist film; the other surface of the film is adhered to a film support. The photoresist layer is thereafter exposed to light according to a predetermined pattern. The support film is thereafter removed and the copper layer is exposed by washing away the unexposed areas of the photoresist layer. The exposed copper layer is then etched away by chemical milling.

In the additive process, there is adhered to the surface of a substrate (which may or may not be copper-clad) one surface of a dry photoresist film; the other surface is adhered to a film support. The dry photoresist layer is thereafter exposed to a predetermined light pattern and the support film is thereafter removed. The substrate is exposed by washing away the unexposed areas of the photoresist layer. At this point, the substrate is treated with appropriate sensitizers and metalizing solutions, whereby a layer of metal, usually copper, is applied to the substrate.

The dry photoresist films are typically formulated to contrast in color with the substrates with which they are used. Since they generally do not change color, it is extremely difficult to inspect the product after exposure to light and prior to removal of the unexposed areas of the photoresist film to insure that the light mask has been properly placed and to be sure that there are no imperfections or defects in the exposed photopolymerizable layer. It is extremely useful to have a dry photoresist film which visually indicates where the film has been exposed to light so that detection of defects can readily be made prior to developing the film and etching the copper-clad panels or building up a layer of metal on the exposed substrate.

It would also be useful to have a liquid photopolymerizable system that is colorless or lightly colored in the unexposed state and which both crosslinks and becomes intensely colored upon exposure to actinic light.

DESCRIPTION OF THE PRIOR ART

Prior artisans who have concerned themselves with phototropic photosensitive systems have attempted to use, as colorformers, arylamines, leuco triphenylmethane dyes and the free bases of ketone imine dyes, of aminotriarylmethane dyes, of aminoxanthene dyes, of aminoacridine dyes, of methine and of polymethine dyes.

SUMMARY OF THE INVENTION

It has now been found that fluoran colorformers can be used to formulate stable phototropic photosensitive compositions. In one embodiment of the invention, there is provided a phototropic photosensitive composition which comprises
a. at least one component capable of curing, crosslinking or polymerizing upon suitable initiation,
b. an initiator for said component that is potentiated by actinic radiation,
c. a fluoran colorformer capable of becoming more intensely colored upon contact with a color activator, and
d. a latent activator for the fluoran colorformer that is capable of activating the fluoran colorformer under the influence of actinic light.

One aspect of this embodiment of the invention relates to the product obtained upon exposing the phototropic photosensitive composition to actinic radiation.

Another embodiment of the invention relates to a dry photoimagable composition, as described, in the form of a thin layer and especially to an assembly comprising a support sheet, a layer of a dry phototropic photosensitive composition as described, one surface of which is adhered to the support sheet, and a transparent sheet adhered to the other surface of said composition.

In another embodiment, the invention relates to a phototropic photosensitive composition, as described, on a support. In one aspect of this embodiment, the support is a conductive metal layer, one surface of which can be in contact with a coextensive surface of an insulating layer. In another aspect of this embodiment, the support is non-conductive.

In yet another aspect the invention relates to solvent-free liquid, actinic radiation curable coating or printing compositions which comprise
a. at least one component capable of curing, crosslinking or polymerizing upon suitable initiation,
b. an initiator for said component that is potentiated by actinic radiation,
c. a fluoran colorformer capable of becoming more intensely colored upon contact with a color activator,
d. a latent activator for the fluoran colorformer that is capable of activating the fluoran colorformer under the influence of actinic light.

These compositions can be applied as decorative or protective coatings to provide highly colored cured products upon exposure to actinic radiation.

DETAILED DESCRIPTION

As indicated above, the invention involves a phototropic photopolymerizable composition comprising:
a. at least one component capable of curing crosslinking or polymerizing upon suitable initiation,
b. an initiator for said component that is potentiated by actinic radiation,
c. a fluoran colorformer capable of becoming more intensely colored upon contact with a color activator,
d. a latent activator for the fluoran colorformer that is capable of activating the fluoran colorformer under the influence of actinic light.

As used herein, the term "phototropic" is intended to identify the capability of a system, such as the composition described above, to darken in response to actinic light; the term is derived from "photo"—indicating light or radiant energy and "tropic"—changing or tending to change in a specified manner in response to a specified stimulus.

Fluoran colorformers contemplated herein are those having the following formula:

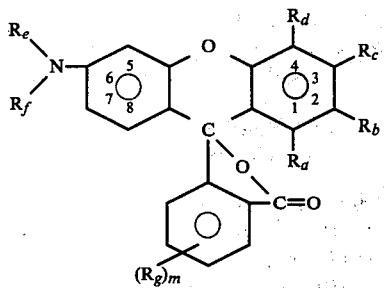

where
- $R_a$ is hydrogen or an aliphatic group of one to 12 carbon atoms that is unsubstituted or optionally substituted and that may be interrupted by

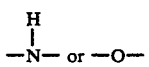

and that is bound directly via carbon or oxygen;
- $R_b$ is an amino group where one or both hydrogen atoms are optionally replaced by unsubstituted or substituted aliphatic groups, cycloaliphatic groups, aromatic groups or mixed aliphatic-aromatic groups or $R_b$ is a heterocyclic group of 3 to 12 ring members bound via a ring nitrogen and containing in addition to nitrogen, one or more of oxygen and sulfur as hetero ring members
or $R_a$ and $R_b$ together form a condensed aromatic nucleus;
- $R_c$ is hydrogen, halogen, an aliphatic group of one to 12 carbon atoms that is unsubstituted or substituted and that may be interrupted by nitrogen or oxygen and that is bound directly via carbon or oxygen, or $R_c$ is an amino group where one or both hydrogen atoms are optionally replaced by unsubstituted or substituted aliphatic groups, cycloaliphatic groups, aromatic groups, mixed aliphatic-aromatic groups or where $R_c$ is a heterocyclic group with three to twelve ring members containing one or more of nitrogen, oxygen and sulfur as hetero ring members or $R_c$ is an aromatic group that is unsubstituted or optionally substituted or a mixed aliphatic-aromatic group or an aromatic ether or aliphatic-aromatic ether group;
- $R_d$ is hydrogen, lower aliphatic or an amino group where one or both hydrogen atoms are optionally replaced by unsubstituted or substituted aliphatic groups, cycloaliphatic groups, aromatic groups, mixed aliphatic-aromatic groups or $R_d$ is a heterocyclic group of 3 to 12 ring members containing one or more of nitrogen, oxygen and sulfur as hetero ring members;
- $R_e$ and $R_f$ each independently is hydrogen, unsubstituted or substituted aliphatic of one to 12 carbon atoms which may be interrupted by oxygen or nitrogen, and which is bound directly via carbon, cycloaliphatic groups, aromatic groups, mixed aliphatic-aromatic groups, or $R_e$ and $R_f$, together with the nitrogen atom form a heterocyclic group of 3 to 12 ring members, optionally containing, in addition to nitrogen, one or more of sulfur and oxygen as hetero ring members;
- $(R_g)_m$ represents one to 3, independently, of hydrogen, lower aliphatic bound directly via carbon or oxygen, or is halogen, acetamido or optionally substituted amino.

Preferably, at least one of $R_b$, $R_c$ and $R_d$ is an amino group, as defined.

Particularly useful are the 2-amino fluoran compounds of formula

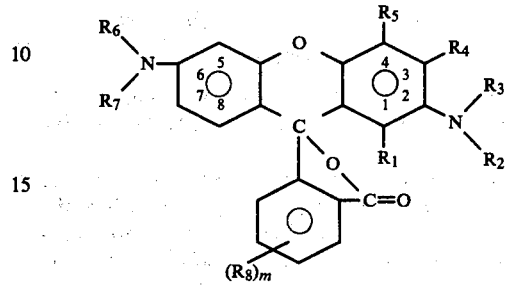

where $R_1$ is hydrogen, halogen, alkyl of one to 12 carbon atoms, alkoxy of one to 12 carbon atoms $R_2$ and $R_3$ each independently is hydrogen, alkyl of one to 12 carbon atoms, alkenyl of 2 to 12 carbon atoms alkoxyalkyl of 2 to 8 carbon atoms, alkoxycarbonylalkyl of 3 to 9 carbon atoms, cycloalkyl of 5 or 6 carbon atoms, acyl of one to 12 carbon atoms, phenyl, naphthyl or benzyl that are unsubstituted or substituted in the aromatic nucleus by one to 3 of amino, mono- or di-alkyl amino of one to 5 carbon atoms, alkyl of one to 7 carbon atoms, alkoxy of one to 7 carbon atoms, carboxyl, alkoxycarbonyl of 2 to 7 carbon atoms, acyl or acylamino of one to 5 carbon atoms, or $MeSO_3$—where Me is alkali metal or $R_2$ and $R_3$ together with the associated nitrogen atom form a heterocyclic radical of 3 to 12 ring members selected from pyrrolidinyl, piperidyl, pipecolinyl, perhydroazepinyl, heptamethyleneimino, octamethyleneimino, indolinyl, 1,2,3,4-tetrahydroquinolinyl, hexahydrocarbazolyl, morpholinyl, thiomorpholinyl, piperazinyl, N-alkyl piperazinyl where the alkyl group contains one to 4 carbon atoms, pyrazolinyl, or 3-methyl pyrazolinyl $R_4$ is hydrogen, alkyl of one to 12 carbon atoms, alkoxy of one to 12 carbon atoms, halogen, amino that is unsubstituted or substituted by one or two of the substituents as defined for $R_2$ and $R_3$, or $R_4$ is phenyl, phenoxy, benzyl or benzyloxy that is unsubstituted or substituted in the aromatic nucleus by one to 3 of amino, mono- or di-alkyl amino of one to 5 carbon atoms, lower alkyl, lower alkoxy, carboxyl, alkoxycarbonyl of 2 to 7 carbon atoms, acyl of one to 5 carbon atoms or $MeSO_3$—where Me is alkali metal $R_5$ is hydrogen, lower alkyl, lower alkoxy or amino that is unsubstituted or substituted by one or two of the substituents as defined for $R_2$ and $R_3$, including the heterocyclic members, $R_6$ and $R_7$, each independently is selected from the same group as defined for $R_2$ and $R_3$, including the heterocyclic members thereof;

$(R_8)_m$, represents one to 3 members independently selected from hydrogen, alkyl of one to 7 carbon atoms, alkoxy of one to 7 carbon atoms, halogen, acetamido, amino or mono- or di-alkyl amino of one to 7 carbon atoms.

Of the compounds described above, those wherein $R_1$ $R_5$ and $R_8$ are hydrogen are of particular interest. These compounds have the general formula

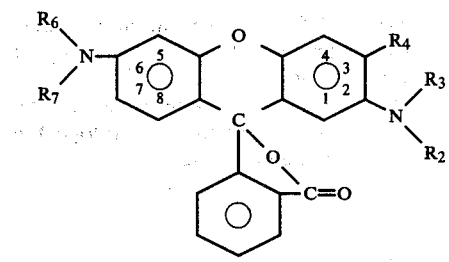

where $R_2$, $R_3$, $R_4$, $R_6$ and $R_7$ are all as previously defined.

Of special interest are the compounds having the preceding formula wherein $R_2$ is hydrogen, alkyl of one to 7 carbon atoms or acyl of one to 7 carbon atoms $R_3$ is hydrogen, alkyl of one to 7 carbon atoms, acyl of one to 7 carbon atoms, phenyl, benzyl or naphthyl or where $R_2$ and $R_3$ together with the associated nitrogen atom form morpholinyl, piperazinyl, pyrrolidinyl or piperidinyl $R_4$ is hydrogen, alkyl of one to 7 carbon atoms or alkoxy of one to 7 carbon atoms $R_6$ and $R_7$ is each alkyl of one to 5 carbon atoms or together with the associated nitrogen form morpholinyl, piperazinyl, pyrrolidinyl or piperidinyl.

Especially preferred are the compounds of formula

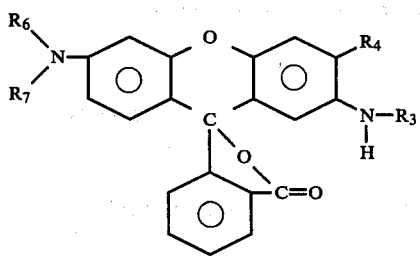

where $R_3$ is hydrogen or phenyl $R_4$ is hydrogen, $(C_1-C_3)$ alkyl or $(C_1-C_3)$ alkoxy $R_6$ and $R_7$ is each $(C_1-C_3)$ alkyl; the compounds found to be notably useful are these where $R_6$ and $R_7$ are both ethyl and where $R_4$ is hydrogen, methyl or methoxy.

Fluoran compounds as described herein are known in the art; they are prepared by reacting a suitable benzophenone with an appropriate phenol derivative in the presence of an acidic condensing agent according to the following general formula

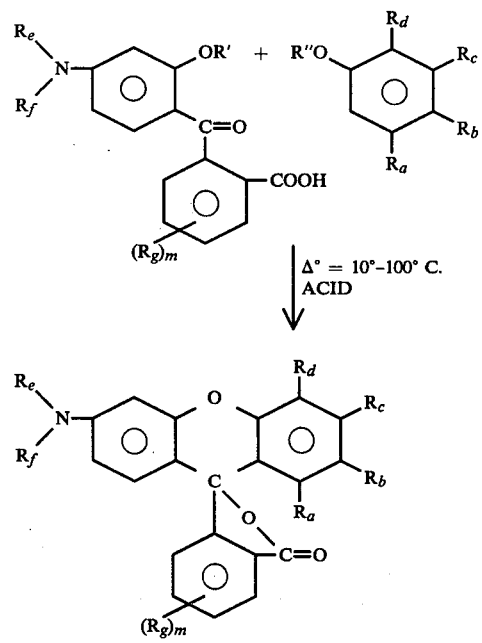

where $R_a$, $R_b$, $R_c$, $R_d$, $R_e$, $R_f$ and $R_g$ are as previously defined and R' and R" are hydrogen or lower alkyl, preferably hydrogen.

The reaction is typically carried out at 10° to 100° C. in the presence of a condensing agent such as acetic anhydride, sulfuric acid, zinc chloride, phosphorous oxychloride and polyphosphoric acid for from 3 to 6 hours; after cooling, the solution is poured into ice water and the product is neutralized with suitable alkali such as an alkali metal hydroxide solution. The crystals are then recovered and purified in known manner, as by recrystallization.

The benzophenone compound can be prepared by reacting a phenol derivative with a phthalic anhydride in an organic solvent such as benzene, toluene, xylene and chlorobenzene, at reflux:

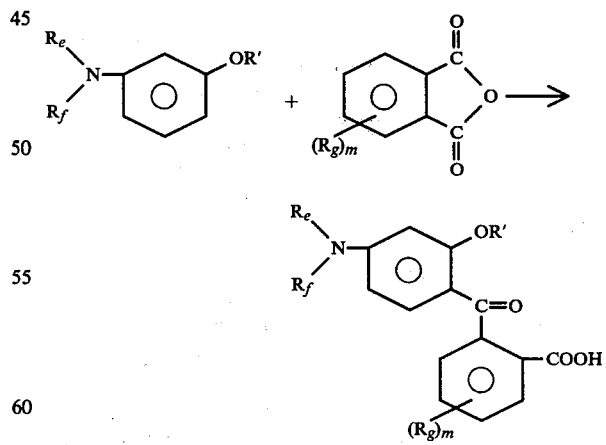

The general art of making fluoran compounds useful herein is described in U.S. Pat. Nos.:
4,007,195
3,997,561
3,929,831
3,681,392

3,514,310
3,501,331
and in British Pat. Nos.:
1,339,316
1,269,601
1,211,393
the compounds described in these patents are also useful herein.

As indicated, there is contemplated a photosensitive composition that contains at least one component capable of curing, crosslinking or polymerizing upon suitable initiation. In one aspect, this component contains at least one polymerizable ethylenicaly unsaturated group of structure

capable of curing, crosslinking or polymerizing under the influence of free radicals. Of these materials, one important class is characterized by the presence of at least one acrylyl or methacrylyl group of formula

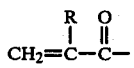

where R is hydrogen or methyl. Monomers, polymers, oligomers and compositions whose functionality is attributable to the presence of acrylate and/or methacrylate groups include acrylic acid, methacrylic acid, acrylamide, methacrylamide, methyl acrylate, methyl methacrylate, ethyl acrylate, ethyl methacrylate hexyl acrylate, cyclohexyl methacrylate, 2-ethylhexyl acrylate, butoxyethoxyethyl acrylate, bicyclo (2.2.1) hept-2-yl acrylate, dicyclopentenyl acrylate, isodecyl acrylate, ethylene diacrylate, diethylene glycol diacrylate, glycerol diacrylate, glycerol triacrylate, ethylene dimethacrylate; ethylene glycol diacrylate, ethylene glycol dimethacrylate, 1,2,4-butanetriol trimethacrylate, 1,4-benzenediol dimethacrylate, 1,4-cyclohexanediol diacrylate, neopentyl glycol diacrylate, triethylene glycol diacrylate, tetraethyleneglycol diacrylate, pentaerythritol mono-,di-,tri-or tetracrylate or mixtures thereof, pentaerythritol tri-or tetramethacrylate, 1,5-pentanediol dimethacrylate, trimethylol propane mono-,di, or triacrylate or mixtures thereof, 2-phenoxyethyl acrylate, glycidyl acrylate, 2-ethoxyethyl acrylate, 2-methoxythyl acrylate, 2-(N,N-diethylamino) ethyl acrylate, omega-methoxyethyl (undecaoxyethylene) acrylate omega-tridecoxyethyl (undecaoxyethylene) acrylate, trimethoxyallyloxymethyl acrylate, bicyclo (2.2.1) hept-2-en-5-ylmethyl acrylate, bicyclo (2.2.1) hept-2-en-5,6-diyl diacrylate, vinyl acrylate, 2-hydroxypropyl acrylate, 2-hydroxyethyl acrylate, (methyl carbamyl) ethyl acrylate and the bis-acrylates and methacrylate of polyethylene glycols of molecular weight 200–1500.

One group of acrylyl and methacrylyl esters that are particularly useful have the general formula

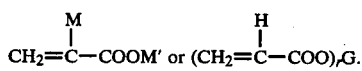

Where the acrylyl compound has the formula

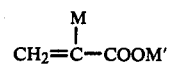

M is H or CH$_3$
M' is cycloalkyl of 5 to 12 carbon atoms (such as cyclopentyl, dicyclopentyl, methyclyclopentyl, dimethylcyclopentyl, etc.)
cycloalkenyl of 5 to 12 carbon atoms (such as cyclopentenyl, methylcyclopentenyl, dicyclopentenyl, bicyclo (2.2.1) hept-2-en-yl, etc.)

—C$_p$H$_{2p}$M" or (C$_q$H$_{2q}$O)$_s$C$_q$H$_{2q+1}$;

where
p is an integer from 1 to 10
q is an integer from 2 to 4
s is an integer from 0 to 4
M" is hydrogen, hydroxyl, phenoxy, alkoxy of 1 to 8 carbon atoms; and where the acrylyl compound has the formula

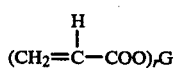

G is a polyvalent alkylene group of formula

—C$_x$H$_{2x-y}$— in which
x is an integer from 2 to 8
y is an integer from 0 to 2
(for example, divalent alkylene when y=0 such as —C$_2$H$_4$—, C$_3$H$_6$—iso—C$_3$H$_6$—,—C$_5$H$_{10}$—, neo—C$_6$H$_{12}$ etc; trivalent alkylene when y=1 such as

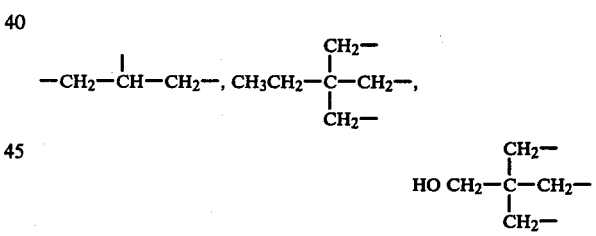

or tetravalent alkylene when y is 2, such as

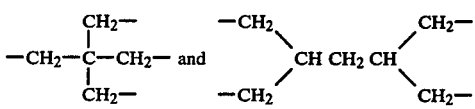

etc.) or G is a divalent ether or ester group of formula

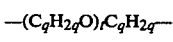

or

where t is an integer from 1 to 5 and q is an integer from 2 to 4 (such as oxyethylene, oxypropylene, oxybutylene, polyoxyethylene, polyoxypropylene, polyoxybutylene, etc.) and r is the valence of G and can be 2 to 4.

Triethyleneglycol diacrylate, tetraethylene glycol diacrylate, pentaerythritol triacrylate, trimethylolpropane triacrylate and pentaerythritol tetraacrylate are especially useful.

Acrylate or methacrylate functionality can be incorporated in polymers and oligomers having carboxyl, hydroxyl oxirane or isocyanate groups via reaction with acrylic monomers. Addition reactions of isocyanates to form urethanes or oxiranes to form esters are relatively straightforward. Other methods of acrylation involving condensation or ester interchange reactions are well known.

Thus, there can be used epoxy acrylates obtained by reacting an epoxy resin with acrylic or methacrylic acid or obtained by reacting a hydroxyalkyl acrylate with an anhydride and reacting that product with a diepoxide. Oils, such as soybean oil and linseed oil, can be epoxidized and acrylated.

Polyester resins, for example from a glycol-dibasic acid condensation, can be acrylated by using acrylic or methacrylic acid to complete the esterification. Another method uses the reaction of an anhydride with a mixture of propylene oxide and glycidyl acrylate to obtain an acrylated polyester.

Acrylated alkyd resins are obtained by the reaction of, for example, a triol, dibasic acid, phthalic anhydride and a fatty acid such as hydrogenated castor oil. After reaction is complete acrylation is achieved by direct esterification with acrylic acid.

Urethane acrylates can be prepared directly by the reaction of a diisocyanate with an hydroxyalkyl acrylate, such as 2-hydroxyethyl acrylate. Oligomers are obtained by using an isocyanate-terminated urethane propolymer for reaction with the hydroxyalkyl acrylate. The urethane prepolymer can be of the polyether or polyester type.

Acrylate functionality can be incorporated in a variety of polymer backbones by incorporating glycidyl methacrylate into the polymer chain and then reacting the pendant oxirane groups with acrylic or methacrylic acid.

Other curable systems are based on unsaturated polyesters such as are obtained from fumaric acid, 4,4'-stilbenedicarboxylic acid, maleic acid, and diallyl ether.

Cinnamate ester groups are also useful, for example in a polyvinyl alcohol-cinnamate ester combination and in conjunction with a variety of polymer materials: polycarbonate cinnamate; polyurethane cinnamate; cinnamyl-modified poly(meth) acrylates; polyepichlorohydrin/cinnamate; poly(cinnamyl methacrylate); epoxy cinnamylidene acetate; carboxycinnamate modified polyesters.

Curable materials are also obtainable from the 2-phenylmaleimido group, allyl ester-maleimide combinations, allthioether polymers, aromatic polysulfone polymer, polysiloxanes, chalcones, sorbic acid derivatives, itaconic acid derivatives and mixtures containing itaconic acid; polyvinyl alcohol, polyvinyl acetate, polyvinyl butyral.

Another polymerizable or curable polymer system is based on the free-radical addition of a thiol to an olefinic double bond:

$$R\text{-}SH + CH_2=CHR' \rightarrow R\text{-}S\text{-}CH_2\text{-}CH_2\text{-}R'$$

When a polyene and a polythiol are admixed and a stimulus that generates free-radicals is present, rapid curing occurs by simultaneous chain extending and crosslinking reactions.

Other crosslinkable, polymerizable or curable materials include the nitriles such as acrylonitrile and methacrylonitrile; the olefins such as dodecene, styrene, 4-methylstyrene, alphamethylstyrene, cyclopentadiene, dicyclopentadiene, butadiene, 1,4-hexadiene, 4-methyl-1-pentene, bicyclo(2.2.1) hept-2-ene, bicyclo(2.2.1) hept-2,5-diene, cyclohexene; the vinyl halides such as vinyl chloride, vinylidene chloride; the vinyl esters such as vinyl acetate, vinyl butyrate, vinyl benzoate, vinyl butyral, vinyl methacrylate, vinyl crotonate; the vinyl ketones such as vinyl methyl ketone, vinyl phenyl ketone, isopropenyl methyl ketone, divinyl ketone, alpha-chloro-vinyl methyl ketone, vinyl phenyl ketone; acrolein and methacrolein; the vinyl ethers and thioethers such as methyl vinyl ether, ethyl vinyl ether, divinyl ether, isopropyl vinyl ether, the butyl vinyl ethers, 2-ethylhexyl vinyl ether, vinyl 2-chloro-ether, vinyl 2-methoxyethyl ether, n-hexadecyl vinyl ether, vinyl methyl sulfide, vinyl ethylsulfide, divinyl sulfide, 1-chloroethyl vinyl sulfide, vinyl octadecyl sulfide, vinyl 2-ethoxyethyl sulfide, vinyl phenyl sulfide, diallyl sulfide; the miscellaneous sulfur and nitrogen containing monomers such as divinyl sulfone, vinyl ethyl sulfone, vinyl sulfonic acid, vinyl ethyl sulfoxide, sodium vinyl sulfonate, vinyl sulfonamide, vinyl pyridine, N-vinyl pyrrollidone, N-vinyl carbazole. Other curable materials are readily apparent to one skilled in the art of polymerization chemistry. The specific compounds mentioned are illustrative only and not all-inclusive. They can be polymerized alone or in mixtures of two or more thereof with the proportions thereof dependent upon the desire of the individual. They can also be blended with polymers.

In another aspect the component that is capable of curing, crosslinking or polymerizing is an epoxy compound that contains one or more 1,2-epoxy groups as follows:

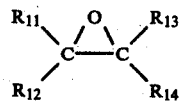

where $R_{11}$, $R_{12}$, $R_{13}$, and $R_{14}$ can be alkyl, aryl, alkoxy, alkenyl and hydrogen.

Thus, there can be used any polymerizable, monomeric or prepolymeric epoxide material or mixture of such epoxide materials containing at least one vicinal epoxide group per molecule. The classic epoxy resin is obtained by the well known reaction of epichlorohydrin and bisphenol A (4,4'-isopropylidenediphenol). The reaction product is believed to have the form of a polyglycidyl ether of bisphenol A (the glycidyl group being more formally referred to as the 2,3-epoxypropyl group) and thus may be thought of as a polyether derived from the diphenol and glycidol (2,3-epoxy-1-propanol). The structure usually assigned to the resinous product is

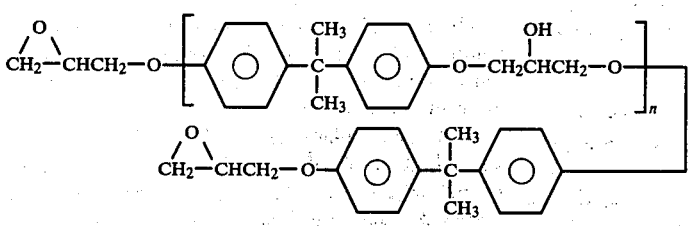

A viscous liquid epoxy resin, average molecular weight about 380, is obtained by reacting the epichlorohydrin in high molecular proportion relative to the bisphenol A, the reaction product containing well over 85 mole percent of the monomeric diglycidyl ether of bisphenol A (n=0), which may be named 2,2-bis [p-(2,3-epoxypropoxy)phenyl] propane, and smaller proportions of polymers in which n is an integer equal to 1,2,3 etc. This product exemplifies epoxide monomers and prepolymers, having a moderate molecular weight preferably of the order of 1,000, or less, which may be cured, crosslinked or otherwise polymerized in accordance with the invention, whereby cleavage of the terminal (vicinal) epoxy or oxirane rings is initiated by the action of the Lewis acid halide released when energy is applied to the photoinitiator, as described below.

Many other epoxide materials are available in polymerizable monomeric or prepolymeric forms. Among these are 1,2-epoxycyclohexane (cyclohexene oxide, also named 7-oxabicyclo [4.1.0] heptane); and vinylcyclohexane dioxide, more specifically named 3-(epoxyethyl)-7-oxabicyclo [4.1.0] heptane or 1,2-epoxy-4-(epoxyethyl) cyclohexane. Ethylene oxide (oxirane,

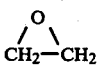

the simplest epoxy ring) and its homologues generally, e. g., propylene oxide (1,2-epoxypropane) and 2,3-epoxybutane, are themselves useful; other useful epoxidic cyclic ethers are the C₃O ring compound trimethylene oxide (oxetane), derivatives thereof such as 3,3-bis(chloromethyl) oxetane (also named 2,2-bis(chloromethyl)-1,3-epoxypropane), and the C₄O ring compound tetrahydrofuran, as examples. Other epoxidized cycloalkenes may be used, a readily available polycyclic diepoxide being dicyclopentadiene dioxide, more specifically identified as 3,4-8,9-diepoxytricyclo (5.2.1.0²,⁶) decane. A suitable polyfunctional cyclic ether is 1,3,5-trioxane.

Glycidyl esters of acrylic acid and of its homologs, methacrylic acid and crotonic acid, are vinyl epoxy monomers of particular interest. Other such monomers are allyl glycidyl ether (1-allyloxy-2,3-epoxypropane) and glycidyl phenyl ether (1,2-epoxy-3-phenoxypropane). Another readily available product is a mixture of ethers of the structure

where R is alkyl, that is, glycidyl alkyl ethers. One such mixture contains predominantly glycidyl octyl ether and decyl glycidyl ether; another contains dedecyl glycidyl ether and glycidyl tetradecyl ether. Epoxidized novolak prepolymers likewise may be used, as well as polyolefin (e.g., polyethylene) epoxides. The latter are exemplified by epoxidized, low molecular weight by-products of the polymerization of ethylene, which may be separated as mixtures high in 1-alkenes in the range from about 10 to 20 carbon atoms, that is from about 1-decene to about 1-eicosene. Epoxidation then provides mixtures of the corresponding 1,2-epoxyalkanes, examples being mixtures high in the 1,2-epoxy derivatives of alkanes having 11 to 14 carbons, or having 15 to 18 carbons.

Esters of epoxidized cyclic alcohols, or of epoxidized cycloalkanecarboxylic acids, or of both, provide useful epoxide or polyepoxide materials. Thus a suitable ester of epoxidized cyclohexanemethanol and epoxidized cyclohexanecarboxylic acid is the diepoxide (3,4-epoxycyclohexyl) methyl 3,4-epoxycyclohexanecarboxylate; this same ester may be indexed under the name 7-oxabicyclo (4.1.0) hept-3-ylmethyl 7-oxabicyclo (4.1.0) heptane-3-carboxylate. Another suitable diepoxide may be obtained as an ester of a substituted (epoxycycloalkyl) methanol and a dibasic acid, for example, bis[(3,4-epoxy-6-methylcyclohexyl) methyl] adipate, which may be named alternatively bis[(4-methyl-7-oxabicyclo [4.1.0] hept-3-yl) methyl] adipate. Diepoxide monomeric materials may be obtained conveniently as bis (epoxyalkyl) ethers of glycols, an example being the diglycidyl ether of 1,4-butanediol, that is, 1,4-bis(2,3-epoxypropoxy) butane. This diepoxide is related to the diglycidyl ether of bisphenol A, shown above as 2,2-bis[p-(2,3-epoxypropoxy) phenyl] propane.

The component capable of curing, crosslinking or polymerizing upon suitable initiation can be used alone in mixtures and/or in conjunction with one or more preformed polymers.

Among the polymers that can be used one can include, for example, the polyolefins and modified polyolefins, the vinyl polymers, the polyethers, the polyesters, the polylactones, the polyamides, the polyurethanes, the polyureas, the polysiloxanes, the polysulfides, the polysulfones, the polyformaldehydes, the phenolformaldehyde polymers, the natural and modified natural polymers, the heterocyclic polymers.

The term preformed polymer as used herein includes the homopolymers and copolymers and includes the olefin polymers and copolymers such as polyethylene, poly(ethylene/propylene), poly-(ethylene/norbornadiene), poly(ethylene/vinyl acetate), poly(ethylene/vinyl chloride), poly(ethylene/ethyl acrylate), poly(ethylene/acrylonitrile), poly(ethylene/acrylic acid), poly(ethylene/styrene), poly(ethylene/vinyl ethyl ether), poly(ethylene/vinyl methyl ketone), polybutadiene, poly(butadiene/styrene/acrylonitrile), poly(vinylchloride), poly(vinylidene chloride), poly(vinyl acetate), poly(vinyl methyl ether), poly(vinyl butyral), polystyrene, poly(N-vinylcarbazole), poly(acrylic acid), poly(methyl acrylate), poly(ethyl acrylate), poly-acrylonitrile, polyacrylamide, poly(methacrylic acid), poly(methyl methacrylate), poly(ethyl methacrylate), poly(N,N-dimethyl acrylamide), poly(methacrylamide), polycaprolactone, poly(caprolactone/vinyl chloride), poly(ethylene glycol terephthalate), poly(captolactam), poly(ethylene oxide), poly(propylene oxide), copolymers of ethylene oxide and propylene oxide with starters containing reactive hydrogen atoms such as the mixed copolymer using ethylene glycol or glycerol or sucrose, etc., as starter, the natural and modified natural polymers such as gutta percha, cellulose, methyl cellulose, starch, silk, wool, and the siloxane polymers and copolymers, the polysulfides and polysulfones, the formaldehyde polymers such as polyformaldehyde, formaldehyde resins such as phenol-formaldehyde, melamineformaldehyde, urea-formaldehyde, aniline-formaldehyde and acetone-formaldehyde.

Selection of the preformed polymer will usually depend on the properties desired of the ultimate, cured product.

The materials utilized as curing, crosslinking or polymerization initiators are radiation-sensitive catalyst precursors that are potentiated by radiation to provide an effective initiator species. Ultraviolet light irradiation is the preferred mode of irradiation.

The known photoinitiators include the azo compounds, organic dyes, sulfur containing compounds, metallic salts and complexes, oximes, amines, polynuclear compounds, peroxides, various halogen-containing compounds and organic carbonyl compounds; they can be used alone, in combination with each other or in combination with various synergistic agents.

The aromatic carbonyl compounds are a quite important group of photoinitiators and include benzoin and the benzoin ethers, benzophenone and derivatives of benzophenone, the monoaryl ketones, the diketones, the xanthones, the thioxanthenones, the quinones, and the thioketones.

In the group of benzoin and the benzoin ethers are included such ethers as benzoin methyl ether; benzoin ethyl ether; benzoin allyl ether; benzoin propyl ether; benzoin isopropyl ether; benzoin butyl ether; benzoin isobutyl ether; benzoin sec-butyl ether; benzoin thiophenyl ether; benzoin amyl ether; benzoin hexyl ether; benzoin octyl ether; benzoin 2-ethylhexyl ether; benzoin nonyl ether; benzoin trimethyhexyl ether; benzoin diethyl ether; benzoin phenyl ether; hydroxyethyl benzoin ether; ethylene glycol benzoin ether; 2-chloroethylbenzoin ether; benzoin isobutoxymethyl ether; α-alkoxybenzoin ethers; benzoin carbamates.

In the group of benzophenone and derivatives of benzophenone are the 4,4'-di(loweralkyl)benzophenones; 4,4'-di(lower alkoxy)benzophenones; 4,4'-diallylbenzophenone; 4,4'-divinylbenzophenone; 4,4'-di(loweracyl)benzophenone; the alkylamino-benzophenones including 4'(dimethylamino)benzophenone; 4-hydroxy-4'-(dimethylamino)benzophenone; 4-hydroxy-4'-(diethylamino)benzophenone; 4-acryloxy-4'-(dimethylamino)benzophenone; 4-methoxy-4'-(dimethylamino)benzophenone; 4,4'-bis(diamino)benzophenone; 4,4'-bis-(dimethylamino)benzophenone; 4,4'-bis-(diethylamino)benzophenone; and p-dichloromethylbenzophenone; 4-iodobenzophenone; p-chlorobenzophenone; 4,4'-bis(bromomethyl)benzophenone; p-hydroxybenzophenone; 2-hydroxy-4-methoxybenzophenone-5-sulfonic acid; p-acryloxybenzophenone; o-methoxybenzophenone; p-methoxybenzophenone; glycidyl ethers of benzophenone; vinyl-substituted benzophenone; 2-isopropenylbenzophenone; monocarboxyl-substituted benzophenone; polycarboxyl-substituted benzophenone; p-nitrobenzophenone; m-benzophenonesulfonyl chloride; p-p'-bis(dimethylamino) thiobenzophenone; phenylthiomethylbenzophenone; benzylthiomethylbenzophenone; benzopinacolone; anthrone; benzanthrone; benzanthronesulfonyl chloride; 9-fluorenone; hydroxyfluorenones; aminofluorenones; 2-bromoethyl-9-fluorenonesulfonyl chloride; 2-methylfluorenone; 1-propylfluorenone; 2,7-dimethylfluorenone; 2-vinylfluorenone; 2-benzylfluorenone; 2-ethoxyfluorenone; 2,6-dimethoxyfluorenone; 2,4,5-trimethylfluorenone; 2-acetylfluorenone; 2-chlorofluorenone; 2,7-dichlorofluorenone; dibenzosuberone; 1-chloromethyl-6-chlorosulfonyl-2-naphthylphenyl ketone; n-methylacridone; poly(vinyl benzophenone).

The monoaryl ketones include acetophenone, propiophenone, butyrophenone, 3-methylacetophenone, 4-vinylacetophenone, 4-(2-ethylhexyl)-acetophenone, 3-allylacetophenone, 4-vinylacetophenone, 4-hexylpropiophenone, 3-butenylbutyrophenone, 4-tolylacetophenone, 3-benzylacetophenone, 3-xylylacetophenone, 3-methoxyacetophenone, 3-methoxybutyrophenone, 3-decoxyacetophenone, 4-heptoxypropiophenone, 3-bromoacetophenone, 4-chloroacetophenone, 3-chloropropiophenone, 4-iodoacetophenone, 1,4-diacetylbenzene, 1,3-diacetylbenzene, 1,3,4-triacetylbenzene, 1,4-dipropionylbenzene, 1,4-dibutyrobenzene, 3,4-dimethylacetophenone, 1-chloroacetophenone, 1-bromoacetophenone, 1,1'-dichlorobenzophenone, 1-chloroanthraquinone, 1-bromoanthraquinone, 1-chloroxanthane, 1-chlorothioxanthone, 2-chlorothioxanthane, 2,2'-dipyridylketone, 2-benzolypridine, 3-benzoylpyridine, 4-benzoylpyridine, 3,4-dihexylacetophenone, 3,4-diethylpropiophenone, 3-methyl-4-methoxyacetophenone, chloroalkylphenyl ketones; α-bromoacetophenone; ortho-bromoacetophenone; trichloroacetophenone; trichloroethylidineacetophenone; 2,2-dichloro-4'-tertiary-butylacetophenone; 2,2,2-trichloro-4'-tertiary-butylacetophenone; α-bromoisobutyrophenone; 2,2-dibromo-2(phenylsulfonyl) acetophenone; α,α-dialkoxyacetophenone; 2,2-dimethoxyacetophenone; 2,2-dimethoxy-2-phenylacetophenone; 2,2-diethoxyacetophenone; o-methoxyacetophenone; m-methoxyacetophenone; p-methoxyacetophenone; 2-butoxy-2-phenylacetophenone; 2-phenylthio-2-phenylacetophenone; ethyl benzoylacetate; para-aminophenyl ketones; cyclohexylphenyl ketone; pivalophenone; valerophenone; and acetonaphthone.

The diketones include biacetyl; benzil dimethyl ketal; 2,3-dibenzoyl-2-norbornene; benzoylbenzal chloride; 2,2-dibromo-2-(phenylsulfonyl) propanedione; a-naphthil; 2,3-butanedione; benzil; pentanedione; 1-aryl-1,2-propanediones; 2,3-bornanedione; phenylpyruvic acid; 2,4-pentanedione.

The xanthones and thioxanthenones include xanthone, 2-methylxanthone, 3-pentylxanthone, 2,6-diethylxanthone, 2-tolyxanthone, 2-methoxyxanthone, 4-methoxyxanthone, 2-acetylxanthone, 2,7-diacetylxanthone, 3-chloroxanthone, 4-bromoxanthone, 2-chloroxanthone, 2,7-dichloroxanthone, 2-chloro-6-nonylxanthone, 2-iodo-5-methoxyxanthone, thioxanthenone; 2-methylthioxanthenone; 3,6-bis(dimethylamino) thioxanthenone; 2-chlorothioxanthenone.

The quinones include p-benzoquinone; o-benzoquinonediazide; anthraquinone; alkylanthraquinones; 2-methylanthraquinone; 2-ethylanthraquinone; 2-tertiary-butylanthraquinone; 2,6-dimethylanthraquinone; 1,5-diethylanthraquinone; 2-vinylanthraquinone; 2-xylylanthraquinone; 2,6-dimethoxyanthraquinone; 2,7-diethoxyanthraquinone; 2-acetylanthraquinone; 2-chloroanthraquinone; 2,4,8-trichloranthraquinone; 2-bromoanthraquinone; aminoanthraquinone; 1,5-diaminoanthraquinone; piperidinoanthraquinones; anthraquinonesulfonyl chloride; benzanthraquinone; 1,4-napthoquinone derivatives; phenanthrenequinones; a-chloroanthraquinone;

The thioketones include thiobenzophenone; p,p'-dimethoxythiobenzophenone; p,p'-bis(dimethylamino) thiobenzophenone.

The azo compounds that are useful include azo compounds, azido compounds and diazonium salts. Azo and azido compounds include 2,2'-azobisisopropane; azobisisobutyronitrile; 2-phenylazobisisobutyronitrile; azobisisobutyramide; azobis (isobutyl acetate); di-(2,4,6-tribromophenyl)-4,4'-azobis (4-cyanovalerate); p-azidobenzaldehyde; b-naphthalenesulfonyl azide; diazomethane; bis(phenylsulfonyl) diazomethane; diazonaphthalenes; diazothioethers; quinone diazides; m,m'-azoxystyrene.

The diazonium salts include those where the diazonium cation (Ar-N$^+$≡N) is p-chlorobenzenediazonium, 2,4-dichlorobenzenediazonium, 2,5-dichlorobenzenediazonium, 2,4,6-trichlorobenzenediazonium, 2,4,6-tribromobenzenediazonium, o-nitrobenzenediazonium, p-nitrobenzenediazonium, 4-nitro-o-toluenediazonium (2-methyl-4-nitrobenzenediazonium), 2-nitro-p-toluenediazonium (4-methyl-2-nitrobenzenediazonium), 6-nitro-2,4-xylenediazonium (2,4-dimethyl-6-nitrobenzenediazonium), 2-chloro-4-(dimethylamino)-5-methoxybenzenediazonium, 4-chloro-2,5-dimethoxybenzenediazonium, 2,4',5-triethoxy-4-biphenyldiazonium (2,5-diethoxy-4-(p-ethoxyphenyl)benzenediazonium), 2,5-dimethoxy-4'-methyl-4-biphenyldiazonium(2,5-dimethoxy-4-(p-tolyl)benzenediazonium), 2,5-diethoxy-4-(phenylthio)benzenediazonium, 2,5-diethoxy-4-(p-tolylthio)benzenediazonium, p-morpholinobenzenediazonium, 2,5-dichloro-4-morpholinobenzenediazonium, 2,5-dimethoxy-4-morpholinobenzenediazonium, 4-(dimethylamino)-1-naphthalenediazonium, and the anion is a metal halide such as tetrachloroferrate(III), FeCl$_4^-$, hexachlorostannate(IV), SnCl$_6^{-2}$, tetrafluoroborate, BF$_4^-$, hexafluorophosphate, PF$_6^-$, hexafluoroarsenate(V), AsF$_6^-$, hexafluorantimonate(V), SbF$_6^-$, hexachloroantimonate(V), SbCl$_6^-$, pentachlorobismuthate(III), BiCl$_5^{-2}$.

Representative diazonium salts include 2,4-dichlorobenzenediazonium tetrachloroferrate (III), p-nitrobenzenediazonium tetrachloroferrate (III), p-morpholinobenzenediazonium tetrachloroferrate (III), 2,4-dichlorobenzenediazonium hexachlorostannate (IV), p-nitrobenzenediazonium hexachlorostannate (IV), 2,4-dichlorobenzenediazonium tetrafluoroborate, p-chlorobenzenediazonium hexafluorophosphate, 2,5-dichlorobenzenediazonium hexafluorophosphate, 2,4,6-trichlorobenzenediazonium hexafluorophosphate, 2,4,6-tribromobenzenediazonium hexafluorophosphate, p-nitrobenzenediazonium hexafluorophosphate, o-nitrobenzenediazonium hexafluorophosphate, 4-nitro-o-toluenediazonium hexafluorophosphate, 2-nitro-p-toluenediazonium hexafluorophosphate, 6-nitro-2,4-xylenediazonium hexafluorophosphate, p-morpholinobenzenediazonium hexafluorophosphate, 4-chloro-2,5-dimethoxybenzene-diazonium hexafluorophosphate, 2,5-dimethoxy-4-morpholino-benzenediazonium hexafluorophosphate, 2-chloro-4-(dimethylamino)-5-methoxybenzenediazonium hexafluorophosphate, 2,5-dimethoxy-4-(p-tolylthio)benzenediazonium hexafluorophosphate, 2,5-diethoxy-4-(p-tolylthio)benzenediazonium hexafluorophosphate, 2,5-dimethoxy-4'-methyl-4-biphenyldiazonium hexafluorophosphate, 2,4',5-triethoxy-4-biphenyldiazonium hexafluorophosphate, 4-(dimethylamino)-1-naphthalenediazonium hexafluorophosphate, p-nitrobenzenediazonium hexafluoroarsenate (V), p-morpholinobenzenediazonium hexafluoroarsenate (V), 2,5-dichlorobenzenediazonium hexafluoroantimonate (V), p-nitrobenzenediazonium hexafluoroantimonate (V), p-morpholinobenzenediazonium hexachloroantimonate (V), 2,4-dichlorobenzenediazonium hexachloroantimonate (V), 2,4-dichlorobenzenediazonium pentachlorobismuthate III, o-nitrobenzenediazonium pentachlorobismuthate III.

The sulfur containing compounds include n-dodecyl mercaptan; 2-mercaptobenzimidazole; diphenyl sulfide; cyclohexylphenylsulfide; benzoin thioethers; benzoin thiophenyl ether; phenylthiomethylbenzophenone; s,s'-diphenyl dithiocarbonate; calcium sulfide; metallic tellurides; diaryl disulfides; diphenyl disulfide; dithiolane; dibenzoyldisulfide; dixanthate; benzothiazoles; 2,2'-dithiobis(benzothiazole); 2-mercaptobenzothiazole; thiazolines; thiocarbamates; dithiocarbamic esters; dithiocarbamic anhydrides; thiurams; toluene sulfonic acid; sulfonyl chlorides; m-(chlorosulfonyl)benzyl chloride; naphthalenesulfonyl chloride; 2-bromoethyl-9-fluorenonesulfonyl chloride; 2,2-dibromo-2(phenylsulfonyl)acetophenone; 2,2-dibromo-2(phenylsulfonyl) propanedione; benzophenonesulfonyl chloride; diphenyl disulfone.

The oximes include o-acyloximes; 1-phenyl-1, 2-propanedione-2-o-benzoyl oxime; oxido-oxazole; benzylmonooxime; biacetyl monooxime phenylcarbamate.

The halogenated organic compounds include chloroform; bromoform; iodoform; carbon tetrachloride; carbon tetrabromide; ethylene dichloride; trichloroethylene; trichloroethane; bromotrichloroethane; vinyl bromide; 1,2-dibromotetrafluoroethane; iodoethane; diacyclhalomethane; hexachloroethane; tetrachloroethane; hexachlorobenzene; o-dichlorobenzene.

The polynuclear compounds include naphthalene; halogenated naphthalenes; 2,3,6-trimethylnaphthalene; a-naphthol; 1-aminonaphthalene; 1-methoxynaphthalene; 2,3-diphenylquinoxaline; anthracene; aminoanthraquinone, phenanthrene; naphthacene; fluorene; 9-fluorenone; stilbene; trinitrofluorenone; polynuclear quinones.

The metal salts and complexes include zinc chloride; zinc bromide; zinc sulfide; ferric chloride; chromium chloride; nickel chloride; tin chloride; stannous chloride; vanadium tetrachloride; vanadium oxychloride; vanadium naphthenate; aluminum chloride; aluminum bromide; aluminum iodide; silver halides; gold salts; sodium chloraurate; mercury salts; mercury iodosulfide; titanium tetrachloride; cadmium sulfide; boron trifluoride; boron trichloride; ceric salts; thallium salts; uranyl salts; cobalt octoate; cobalt naphthenate; magnesium oxide; zinc oxide; titanium dioxide; alumina; cupric oxide; chromium oxide; silver oxide compounds; metal chelates; metal amine complexes; cobalt EDTA complexes; iron EDTA complexes; metal acetylacetonate; manganese tris (acetylacetonate); metal salt-saccharide complexes; metal oxalato complexes; p-benzoquinone complexes; copper (I) complexes; manganese carbonyl; rhenium carbonyl; osmium carbonyl; iron carbonyls; metal thiocarbonyls; trialkylaluminum; diethylaluminum chloride; triphenylmethyldiethyltitanium chloride; bis(2-chloroethyl) diethyltitanium; tetrabenzyltitanium; ferrocene; cyclopentadienylmanganese tricarbonyls.

The peroxides include hydrogen peroxide; benzoyl peroxide; tertiary-butyl peroctoate; t-butyl a-cyanoperacetate; t-butyl hydroperoxide; di-t-butyl peroxide; cumene hydroperoxide; a-cumyl peroxide; ergosterol peroxide; fluorenone hydroperoxide; acetyl peroxide.

The imidazoles include benzimidazoles; 2-methylbenzimidazole; 2-mercaptobenzimidazole; triphenylimidazolyl dimers.

Ammonium salts include bipyridylium salt; benzyltrimethylammonium chloride.

Organic dyes that are useful include acridines; benzacridine; benzidines; b-carotene; chlorophyll; crystal violet; eosin; erythrosine; fluorescein; indanthrene yellow; irgazin yellow; methyl violet; methylene blue; pyronine-G; rhodamines; riboflavin; rose bengal; thiazine dyes; thionine; xanthene dyes; xanthophyll; iodoeosine.

Where the component capable of curing, crosslinking or polymerization contains an ethylenically unsaturated group, and notably an acrylyl or methacrylyl group, the preferred free radical photoinitiators are the benzoin ethers, benzophenone, the alkylamino benzophenones, the xanthones, the thioxanthones as well as combinations of said photoinitiators with each other and with chain transfer agents such as organic amines.

Where said component is an epoxide, the preferred photoinitiator is a diazonium salt; since this type of photoinitiator generates a Lewis acid, no separate activator is required.

Prior to describing activators within the scope of this invention, it must be understood that the fluoran compounds described herein are converted to dark colored products by contact with an acidic substance. The acidic materials are those falling within the definition of a Lewis acid, that is, an electron acceptor. Thus, the activators useful herein will either generate a Lewis acid or will facilitate the production of a Lewis acid from some other source.

The ability of a diazonium metal halide salt to liberate a Lewis acid under the influence of actinic radiation has been previously discussed; these diazonium salts represent one group of compounds useful as activators.

A second class of materials useful as activators is the combination of a proton donor and a halogenated compound in the presence of a free radical type photoinitiator. While not wishing to be bound to any theoretical explanation for the chemistry of this activator system, the perceived results may be explained as follows. The proton donor (PD), whether by the effect of the free radical initiator (In) or otherwise, provides protons that are effective to convert the fluoran compound to the dark colored reaction product. The halogenated compound, functioning as an electron sink, pushes the reaction to the right, encouraging proton formation:

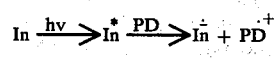

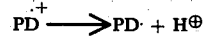

-continued

The proton donor can be an amine, an arsine or a phosphine and can be represented by the formula

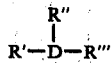

where D is N, As or P R' and R", each independently is hydrogen, linear or branched alkyl of from 1 to about 12 carbon atoms, linear or branched alkenyl of from 2 to about 12 carbon atoms, cycloalkyl of from 3 to about 10 ring carbon atoms, cycloalkenyl of from 3 to about 10 ring carbon atoms, aryl of from 6 to 12 ring carbon atoms, alkaryl of from 6 to about 12 ring carbon atoms, aralkyl of from 6 to about 12 ring carbon atoms, R''' has the same meaning as R' and R" except that it cannot be hydrogen and cannot be aryl when both R' and R" are aryl; the aryl groups can be unsubstituted or substituted by one or more of amino, mono-or di- (lower alkyl) amino loweralkylcarbonyl, loweralkoxycarbonyl, loweralkylcarbonyloxy, phenylcarbonyl or aminophenylenecarbonyl where the amino group is unsubstituted or substituted by lower alkyl.

Additionally, R" and R''' together with D can form a heterocyclic group. Thus R" and R''' together can be divalent alkylene of 2 to 12 carbon atoms, divalent alkenylene of 3 to 12 carbon atoms, divalent alkadienylene of 5 to 10 carbon atoms, divalent alkatrienylene of from 5 to 10 carbon atoms, divalent alkyleneoxyalkylene having a total of from 4 to 12 carbon atoms or divalent alkyleneaminoalkylene having a total of from 4 to 12 carbon atoms.

Because of ready availability, lower toxicity and stability, the amines are preferred; representative specific organic amines include methylamine, dimethylamine, trimethylamine, diethylamine, triethylamine, propylamine, isopropylamine, diisopropylamine, triisopropylamine, butylamine, tributylamine, t-butylamine, 2-methybutylamine, N-methyl-N-butylamine, di-2-methylbutylamine, trihexylamine, tri-2-ethylhexylamine, dodecylamine, tridodecylamine,tri-2-chloroethylamine, di-2-bromoethylamine, methanolamine, ethanolamine, diethanolamine, triethanolamine, N-methyldiethanolamine, N,N-dimethylethanolamine, N-methyldiethanolamine, isopropanolamine, propanolamine, diisopropanolamine, triisopropanolamine, N-butylethanolamine, dihexanolamine, 2-methoxyethylamine, di-2-ethoxyethylamine, tri-2-ethoxyethylamine, 2-hydroxyethyldiisopropylamine, 2-aminoethylethanolamine, allylamine, butenylamine, dihexadienylamine, cyclohexylamine tricyclohexylamine, trimethylcyclohexylamine, bis-methylcyclopentylamine, tricyclohexenylamine, tricyclohexadienylamine, tricyclopentadienylamine, N-methyl-N-cyclohexylamine, N-2-ethylhexyl-N-cyclohexylamine, diphenylamine, phenyldimethylamine, p-acetylphenyldimethylamine, p-caprylphenyl dimethylamine, methylphenylamine, ditolylamine, p-dimethylaminophenyl acetate, p-dimethylaminophenyl valerate, trixylylamine, tribenzylamine, triphenethylamine, benzyldimethylamine, benzyldihexlamine, ethyl dimethylaminobenzoate, heptyl dimethylaminobenzoate, tris-chlorophenethylenimine, N-methylethylenimine, N-cyclohexylethylenimine, piperidine, N-ethylpiperidine, 2-methylpiperidine, 1,2,3,4- tetrahydropyridine, 1,2,-dihydropyridine, 2-,3- and 4-picoline, morpholine, N-methylmorpholine, N-2-hydroxyethylmorpholine, N-2-ethoxyethylmorpholine, piperazine, N-methylpiperazine, N,N'-dimethylpiperazine, 2,2-dimethyl-1,3- bis [3-(N-morpholinyl)-propionyloxy] propane, 1,5-bis [3-(N-morpholinyl)-propionyloxy diethyl] ether, N,N-dimethylbenzylamine, ethyldiethanolamine; triethanolamine; p-nitroaniline; n-acetyl-4-nitro-1-naphthylamine; aminoanthraquinone.

A preferred group of amines are the p-aminophenyl ketones of general formula

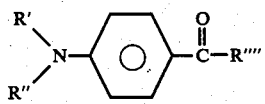

Where R' and R" are alkyl of one to 4 carbon atoms and R"" is alkyl of one to 12 carbon atoms, alkoxy of one to 12 carbon atoms, phenyl, loweralkyliminophenylene or di(loweralkyl) aminophenylene.

Representative compounds include p-(dimethylamino) acetophenone; p-(dimethylamino) propiophenone; p-(dimethylamino) butyrophenone; p-(dimethylamino) valerophenone; p-(dimethylamino) myristylphenone; the p-(diloweralkylamino) benzoic acid esters such as p-(dimethylamino) benzoic acid ethyl ester; p-(dimethylamino) benzoic acid butyl ester; p-(dimethylamino) benzoic acid lauryl ester; p-(dimethylamino) benzoic acid myristyl ester; 4-dimethylaminobenzophenone; 4-dimethylamino-4'-propylaminobenzophenone; and 4,4'-bis(dimethylamino) benzophenone.

One class of useful halogenated compounds comprises the halogenated hydrocarbons; these can be aromatic, aliphatic, alicyclic, and combinations thereof. In addition to halogen, these compounds can be substituted by oxygen, amine, amide, hydroxyl, nitrile or phosphate. The hydrocarbyl rings or chains can be interrupted by ether (—O—), ester

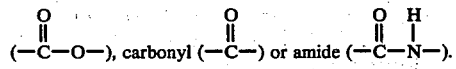

Halogenated aliphatic compounds include the halogenated alkanes and alkenes of 1 to about 8 carbon atoms, illustrated by such alkanes as carbon tetrachloride; carbon tetrabromide; bromoform iodoform; iodoethane; 1,2-diiodoethane; 2-bromo-1-iodoethane; 1,2-dibromoethane; 1-bromo-1-chloroethane; 1,1,2,2-tetrabromoethane; hexachloroethane; 1,1,1-trichloroethane; 1,1-bis-(p-chlorophenyl)-2,2,2-trichloroethane; 1,2-dibromo-1,1,2-trichloroethane; 1-bromo-3-chloropropane; 1,2-dibromo-3-chloropropane; 1,2,3-tribromopropane; 1-bromobutane; 2-bromobutane; 1,4-dibromobutane; 1-bromo-4-chlorobutane; 1,4-diiodobutane; 1,2,3,4-tetrabromobutane; pentamethylene bromide; hexamethylene bromide, etc.; the halogenated alkanols of 2 to about 8 carbon atoms such as 2-bromoethanol; 2,2,2-trichloroethanol; tribromoethanol; 2,3-dibromopropanol; 1,3-dichloro-2-propanol; 1,3-diiodo-2-propanol; 1,1,1-trichloro-2-propanol; di(iodohexamethylene) aminoisopropanol; 1,1,1-trichloro-2-methyl-2-propanol; tribromo-t-butyl alcohol; 2,2,3-trichlorobutane-1,4-diol; halogenated cycloaliphatic compounds such as tetrachlorocyclopropene; dibromocyclopentane; hexachlorocyclopentadiene; dibromocyclohexane; chlorendic anhydride; the halogenated aliphatic carbonyl containing compounds of 2 to about 8 carbon atoms, which are illustrated by 1,1-dichloroacetone; 1,3-dichloroacetone; hexachloroacetone; hexabromoacetone; pentachloroacetone; 1,1,3,3-tetrachloroacetone; 1,1,1-trichloroacetone; 3,4-dibromobutanone-2; 1,4-dichlorobutanone-2; 1,2,5-trichloropentanone-2; dibromocyclohexanone; the halogenated ethers of 3 to about 8 carbon atoms are illustrated by 2-bromoethyl methyl ether; 2-bromoethyl ethyl ether; di(2-bromoethyl)ether; di-(2-chloroethyl)ether; 1,2-dichloroethyl ethyl ether.

The amide and ester compounds are conveniently discussed in connection with the halogenated mono or dicarboxylic acids of 2 to 8 carbon atoms, as the esters and amides thereof. These compounds will have the general formula

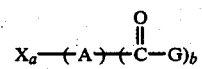

where
X is Cl, Br or I
a is an integer from 1 to 4
A is alkyl or alkenyl of 1 to 7 carbon atoms
G is

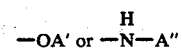

where A' is alkyl or haloalkyl of 1 to 15 carbon atoms where halo is Cl, Br or I; A" is hydrogen, alkyl or haloalkyl of 1 to 4 carbon atoms where halo is Cl, Br or I;
b is 1 or 2.

In providing that a is an integer from 1 to 4, it is noted that the obviously chemically impossible structures such as tetrachloroacetamide and $\beta,\beta,\beta$-trichlorobutyramide are excluded. Thus, the provision that a is an integer from 1 to 4 is intended to be a shorthand way of indicating that a is an integer from 1 to 3 when A has one carbon atom and that a is an integer from 1 to 4 when A has 2 to 7 carbon atoms, provided that no carbon atom bound to two other carbon atoms contains more than two halogen atoms and no carbon atom bound to one carbon atom contains more than 3 halogen atoms.

A can be methyl, ethyl, propyl, butyl, amyl, hexyl, heptyl, including the isomers thereof, vinyl, allyl, isopropenyl, butenyl, isobutenyl, or pentenyl.

The acids are exemplified by chloroacetic; bromoacetic; iodoacetic; dichloroacetic; trichloroacetic; tribromoacetic; 2-chloropropionic; 3-bromopropionic; 2-bromoisopropionic; 2,3-dibromopropionic; 3-iodopropionic; α-bromobutyric; α-bromoisobutyric; 3,4-dibromobutyric; etc.; bromosuccinic; bromomaleic and dibromomaleic.

The ester can be the ester of a halogenated carboxylic acid as described and exemplified above, the halogenated ester of a carboxylic acid or the halogenated ester of a halogenated carboxylic acid. The esters are exemplified by bromoethyl acetate; ethyl trichloroacetate; trichloroethyl trichloroacetate; isooctyl trichloroacetate; isotridecyl trichloroacetate; homopolymers and copolymers of 2,3-dibromopropyl acrylate; trichloroethyl dibromopropionate; iodoethyl dibromobutyrate;

ethyl, α,β-dichloroacrylate; ethyl, 3,4-dibromovinylacetate, etc.

The amides are exemplified by chloroacetamide; bromoacetamide; iodoacetamide; dichloroacetamide; trichloroacetamide; tribromoacetamide; trichloroethyl trichloroacetamide; 3-bromopropionamide; 2-bromoisopropionamide; 2,3-dibromopropionamide; 2,2,2-trichloropropionamide; 2-bromobutyramide; 2-bromoisobutyramide and N-chlorosuccinimide, N-bromosuccinimide, 2,3-dibromosuccinimide, 2,3,4,5-tetraiodopyrrole and N-[1,1-bis-(p-chlorophenyl)-2,2,2-trichloroethyl] acetamide.

Preferred amides are those melting in the range 90° to 150° C. such as

| Compound | Melting Point °C. |
| --- | --- |
| $BrCH_2CONH_2$ | 91° |
| $ClCH_2CONH_2$ | 121° |
| $Cl_2CH\ CONH_2$ | 99.4° |
| $I\ CH_2CONH_2$ | 95° |
| $Br_3\ C\ CONH_2$ | 121.5° |
| $Cl_3\ C\ CONH_2$ | 142° |
| $Br\ CH_2CH_2CONH_2$ | 111° |
| $(CH_3)_2\ C\ Br\ CONH_2$ | 148° |
| $CH_3CH_2CH\ Br\ CONH_2$ | 112.5° |
| $(CH_3)_2\ CHCH\ Br\ CONH_2$ | 133° |

Other halogenated aliphatic hydrocarbyl compounds include chlorinated rubbers such as the Parlons (Hercules Powder Co.); poly (vinyl chloride); copolymers of vinyl chloride and vinyl isobutyl ether such as Vinoflex MP-400 (BASF Colors & Chemicals, Inc.); chlorinated aliphatic waxes such as Chlorowax 70 (Diamond Alkali, Inc.); perchlorocyclodecane such as Declorane+ (Hooker Chemical Co.); chlorinated paraffins such as Clorafin 40 (Hooker Chemical Co.) and Unichlor-70B (Neville Chemical Co.); and 2,3-bis-(bromoethyl)-1,4-dibromo-2-butene.

The aromatic hydrocarbyl compounds include the polyhalo benzenes such as the di-, tri-, tetra-, penta- and hexachlorobenzenes and bromobenzenes; the di-, tri-, and tetra- chloroxylenes and bromoxylenes; di- and trichloroaniline and bromoaniline; the polyhalogenated polyphenyl compounds such as the Araclor plasticizers (Monsanto Chemical Co.) which in general are polychlorinated diphenyls, polychlorinated triphenyls and mixtures thereof; hexabromobiphenyl, tetrabromobisphenol A etc.

While it is apparent that both aliphatic and aromatic halides can be successfully employed, it is preferred to use the aliphatic halides; of the aliphatic halides, it is generally preferred to use those halides having more than one halogen atom bound to the same carbon atom, and it is particularly preferred to use those halogenated aliphatic compounds where there are three halogen atoms bound to a single carbon atom. The halogen containing material can be present as single compound or as a mixture of halogen containing compounds.

Where the compositions are to be prepared and stored for periods of time, stability becomes a factor. For that reason, the volatile materials such as carbon tetrabromide, iodoform, ethyl iodide and 2,2,2-trichloroethanol, which work quite well are contraindicated in systems that will be stored for appreciable periods. These compounds are further undesirable because of the odor due to their volatility. Thus, the halogenated compounds that are nonvolatile liquids or solids are preferred.

From the foregoing, it is apparent that in one aspect the invention relates to a phototropic photosensitive composition comprising
 a. an epoxide
 b. a fluoran colorformer
 c. a latent Lewis acid generator In another aspect, the invention relates to a phototropic photosensitive composition comprising
 a. an ethylenically unsaturated component
 b. a photoinitiator
 c. a fluoran colorformer
 d. a latent Lewis acid source In one embodiment of this aspect, the composition comprises
 a. an ethylenically unsaturated component capable of free radical initiated curing, crosslinking or polymerization;
 b. a free radical generator
 c. a fluoran colorformer
 d.
  1. a hydrogen donor
  2. a halogenated compound In another embodiment of this aspect, the composition comprises
 a. an ethylenically unsaturated component capable of free radical initiated curing, crosslinking or polymerization;
 b. a free radical generator
 c. a fluoran colorformer
 d. a diazonium metal halide salt In still another embodiment of this aspect the composition comprises
 a. an ethylenically unsaturated component capable of free radical initiated curing, crosslinking or polymerization;
 b. a free radical generator
 c. a fluoran colorformer
 d.
  1. a hydrogen donor
  2. a halogenated compound
  3. a diazonium metal halide salt Where the free radical generator is a combination that includes a hydrogen donor, such as benzophenone, and an amine, such as an alkylamino benzophenone, another hydrogen donor need not be added. Thus an amine, if present, can perform two functions: as a chain transfer agent and as a proton donor in connection with activation of the fluoran colorformer.

In the preferred embodiments the photosensitive phototropic composition comprises
 a. an acrylyl or methacrylyl compound
 b. a photoinitiator
 c. a fluoran colorformer
 d.
  1. an amine
  2. a halogenated compound and the particularly preferred embodiments are those where the photoinitiator is one or more of a benzoin ether, benzophenone, a derivative of benzophenone, a monoaryl ketone, a xanthone, a thioxanthone, or a quinone and the halogenated compound is an ester or amide of a halogenated carboxylic acid of 2 to 8 carbon atoms and the fluoran is a 2-amino fluoran. Thus in the particularly preferred embodiments the compositions comprise
 a. an acrylyl or methacrylyl compound b. a benzoin ether, benzophenone, a loweralkylamino benzophenone, a monoaryl ketone, a xanthone, a thioxanthone, a quinone or mixture thereof c. a 2-amino fluoran colorformer d.
1. a tertiary amine
2. an amide or ester of a halogenated mono or dicarboxylic acid of 2 to 8 carbon atoms.

The compositions of the present invention may be used in relatively thick layers or may be cast as thin films having thicknesses of from about 0.25 to about 5 mils or even more. When prepared in the form of an assembly comprising a support, composition and transparent sheet, i.e., dry film photoresist, the composition will generally be from 0.5 to 5 mils thick. Suitable base or support materials include metals such as steel, aluminum, and copper in the form of plates, sheets and foils; film-forming synthetic resins or high polymers such as addition polymers and copolymers of vinyl chloride, vinylidine chloride, vinyl acetate, acrylonitrile, ethylene, propylene, etc.; and condensation polymers such as polyethylene terephthalate and polyamides and thermoset composites such as fiberglass-epoxy and paper-phenolic laminates.

A typical useful dry film resist will contain:

| Component | Broad Range (weight %) | Preferred Range (weight %) |
|---|---|---|
| Preformed polymer binder | 40–70% | 50–70% |
| Polymerizable, curable or crosslinkable component | 30–50% | 30–40% |
| Photoinitiator(s) | 1–10% | 1–5% |
| Fluoran Colorformer | 0.01–2% | 0.5–1.5% |
| Halogenated compound | 0.1–5% | 0.5–2% |
| Amine | 0.1–10% | 0.2–5% |

The dry film phototropic photosensitive composition can additionally contain other conventional components such as thermal polymerization inhibitors, antioxidants, adhesion promoters and the like.

In use, the photopolymerizable dry film is exposed to a source of actinic radiation which may be through a halftone image or a process transparency; e.g., a process negative or positive, stencil or a mask. Exposure may also be through a continuous tone, negative or positive image. The exposure can be by the contact or projection method, with or without a cover sheet over the photopolymerizable layer or by projection using a cover sheet. These procedures are well known to those skilled in the art. The photoresist compositions are generally used in conjunction with ultraviolet light and the radiation source should furnish an effective amount of this radiation; point or broad radiation sources are effective. Such sources include carbon arcs, mercury-vapor arcs, fluorescent lamps with ultraviolet radiation emitting phosphors, argon glow lamps, electronic flash units and photographic flood lamps. Of these, the mercury vapor arcs, particularly the sun lamps, are most suitable.

The dry film photoresist compositions after exposure can be developed in known manner, for example by impingement of spray jets, with agitated immersion, brushing or scrubbing to desirable images with an organic solvent or mixture thereof capable of washing away the unexposed portions of the resist film. Useful solvents include cellosolve acetate, ethyl acetate, methyl ethyl ketone, acetone, trichloroethylene, carbon tetrachloride, tetrachloroethylene, the alkanols of one to four carbon atoms, butyl cellosolve, chlorobenzene and dimethylformamide. Where the resist has been formulated to be developed by aqueous alkali, solutions of sodium carbonate, sodium hydroxide, trisodium phosphate and the like can be used, either alone or in admixture with each other or with one or more solvents.

The phototropic compositions are also useful in ultraviolet-curable coating and printing compositions. One advantage that attends such compositions formulated with the phototropic dye systems is that thicker coatings can be employed than was previously the case since actinic light can penetrate through to the bottom of the coating before the color of the composition has intensified. Since color can now be obtained without pigments and the like which interfere with the penetration of actinic light, thicker, more resistant coatings are obtainable.

The coating and printing compositions can be based on an epoxide or on an ethylenically unsaturated component, both as previously described. Generally, these compositions will contain from about 0.1 to about 2% of fluoran compound, from about 0.1 to about 5% of halogenated compound (whether diazonium metal halide salt or halogenated compound as described); where the activator is an amine-halogenated hydrocarbon, the amine will be present in an amount of from 0.1 to 10%; the compositions will generally contain from about 1 to 10% by weight of photoinitiator. The balance of the compositions will be monomeric (including reactive oligomers) compounds, polymeric binders, plasticizers, adhesion promoters, antioxidants, fillers, thioxtropic agents and leveling agents. Pigments can be added if desired.

These compositions can be applied by screen or other printing techniques or by brushing, roller coating, knife coating, curtain coating, etc.

While the epoxide and ethylenically unsaturated compounds previously described are useful, the acrylyl and methacrylyl compounds, notably the acrylyl oligomers and esters, as described above, are particularly useful.

One useful class of oligomers is obtained by reacting an organic polyether or polyester polyol with a diisocyanate to provide an isocyanate-terminated prepolymer. This product can be reacted with an unsaturated alcohol, such as a hydroxy alkyl acrylate to provide, either alone or in combination with other unsaturated monomers, a material that will polymerize under the influence of free radicals to form a hard, tough, adherent film.

In a variation of the foregoing, a polymercaptoester such as trimethylolpropane-tris-(thioglycolate); trimethylolpropane tris-(mercaptopropionate); pentaerythritol tetrakis(thioglycolate); pentaerythritol tetrakis-(mercaptopropionate); and the like are reacted with a diisocyanate to provide a polythiourethane intermediate which can be reacted with an unsaturated alcohol, such as a hydroxy acrylate to provide, either alone or in combination with other unsaturated monomers, a free radical polymerizable material having excellent film properties after crosslinking.

Another illustration of a useful oligomer is an acrylate-capped polycaprolactone polyurethane, obtained by reacting a hydroxy-terminated polycaprolactone with a diisocyanate and thereafter reacting the isocyanate-terminated intermediate with an unsaturated alcohol such as a hydroxyalkyl acrylate.

Still another useful class of oligomers is obtained by reacting an epoxy resin with acrylic acid to obtain an epoxy diacrylate. For example, an epichlorohydrin/bisphenol A-type epoxy resin can be reacted with a stoichiometric amount of acrylic acid. Such products are available commercially as under the trademark "Epocryl" from Shell Chemical Company. Such materials can be combined with a variety of acrylic esters including neopentyl glycol diacrylate, hydroxyethyl acrylate and dicyclopentenyl acrylate and other unsaturated esters of polyols including such esters of methylene carboxylic acid such as, ethylene glycol diacrylate; diethylene glycol diacrylate; glycerol diacrylate; glycerol triacrylate; ethylene glycol dimethacrylate; 1,3-propylene glycol dimethacrylate; 1,2,4-butanetriol trimethacrylate; 1,4-benzenediol dimethacrylate; pentaerythritol tetramethacrylate; 1,3-propanediol diacrylate; 1,6-hexanediol diacrylate; the bis-acrylates and methacrylates of polyethylene glycols of molecular weight 200-500; trimethylolpropane triacrylate; pentaerythritol triacrylate; and other ethylenically unsaturated compounds, to polymerize under the influence of free radicals to form films of excellent adhesion and toughness.

Another composition comprises a combination of a terminally unsaturated urethane composition (polyene) and a polythiol which are polymerizable under the influence of free radicals generated by the action of actinic light on a photoinitiator.

The coating and printing ink compositions will contain a predominant amount of film-forming materials and photosensitizer and a relatively minor amount of fluoran compound halogen compound and amine. For example, a typical composition will contain from 15 to 70% by weight of an ethylenically unsaturated compound, 10-50% of one or more unsaturated monomers or of a preformed polymeric binder, 0.1 to 10% by weight of a photoinitiator; 0.01 to 2% by weight of fluoran compound as described above, 0.1 to about 5% of halogen containing compound and 0.1 to 10% of amine. A more narrow range is from about 40 to about 55% by weight of ethylenically unsaturated compound, from 30-45% of monomer or of polymeric binder from 1 to 5% of initiator, from 0.5 to 1.5% of fluoran compound, from 0.5 to 2% of halogen compound and from 0.2 to 5% of amine.

The invention is further illustrated by the following examples.

EXAMPLE A 2-anilino-6-diethylaminofluoran

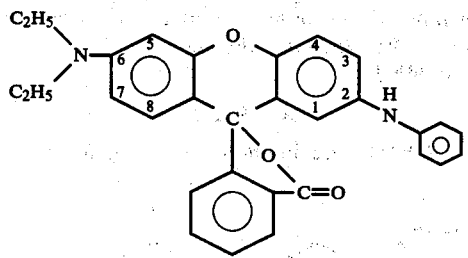

Heat together 2.2 parts by weight of 2-carboxy-4'-diethylamino-2'-hydroxybenzophenone, 1 part by weight of p-nitrophenol and 40 parts by weight of 90 weight percent $H_2SO_4$ for about 1 hour at 150° C. Thereafter pour the mixture into about 225 parts by weight of ice and raise the pH to about 8 by addition of dilute $NH_4OH$. Extract this solution with benzene and thereafter wash the benzene with 10 percent by weight aqueous NaOH and then with water. Purify the washed benzene extract by passage through an activated alumina chromatograph column. Concentrate the resulting solution by evaporation, add petroleum ether and recrystallize. Reduce the product with stannous chloride solution, extract with benzene and recrystallize to obtain 2-amino-6-diethylaminofluoran. Reflux 7.8 parts by weight of this product, 4 parts by weight of o-bromobenzoic acid, 2.8 parts by weight of potassium carbonate, 0.1 part by weight of copper powder and 40 parts by weight of amyl alcohol for about 3 hours. Cool and add petroleum ether to separate the crude reaction product. Heat the crude reaction product to 250°-260° C. to decarboxylate, then dissolve in benzene and wash twice with 1 weight percent aqueous sodium carbonate and once with water. Concentrate the benzene solution by evaporation and precipitate with petroleum ether. Dissolve the product in benzene, purify over activated alumina, recrystallize using petroleum ether and recover the product.

EXAMPLE B 2-(2'-methoxycarbonyl anilino)-6-diethylamino fluoran

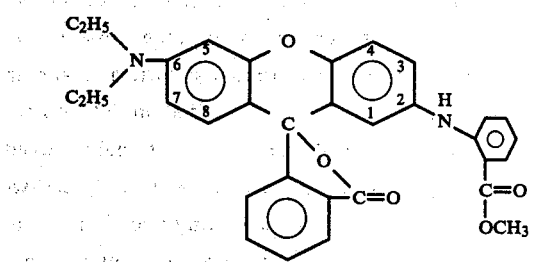

The crude reaction product of Example A is methylated by refluxing 1 part by weight of said reaction product with 0.3 parts by weight of dimethylsulfate, 0.5 parts by weight of dicyclohexylamine and 12 parts by weight of acetone for about 15 minutes. Evaporate the solvent and then heat over a steam bath for an additional 15 minutes. Extract with benzene and purify through activated alumina. Concentrate by evaporation and add petroleum ether to crystallize the reaction product.

EXAMPLE C 2-(2'-methoxycarbonyl-anilino)-3-methyl-6-diethylaminofluoran

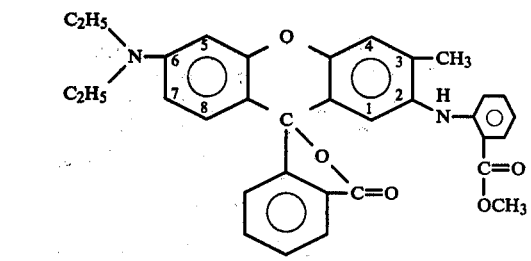

Following the procedure of Example A, but using 3-methyl-4-nitrophenol in place of p-nitrophenol, there is obtained 2-amino-3-methyl-6-diethylaminofluoran. Reacting this product with o-bromobenzoic acid in the manner described in Example A provides the carboxylic acid-containing crude reaction product. Methylating this crude reaction product according to Example B provides the desired product.

EXAMPLE D 2-anilino-3-methyl-6-diethylaminofluoran

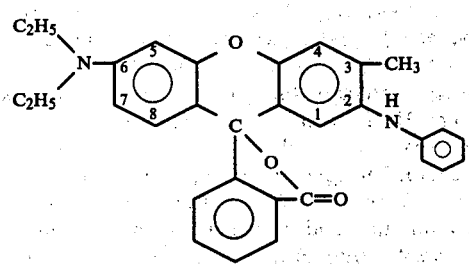

Decarboxylation of the carboxylic acid-containing crude reaction product of Example C as described in Example A, provides the desired product.

By an alternate route, one gram of 2'-carboxy-4-diethylamino-2-hydroxybenzophenone can be dissolved in a mixture of 4 ml. of concentrated sulfuric acid and an equal volume of fuming sulfuric acid at an $SO_3$ content of 20% with mechanical stirring, and externally cooled to about 15° C. Add 1.9 grams of 4-amino-3-methylphenol gradually and continue stirring over 16 hours at about 20° C. Thereafter, pour the reaction mixture into about 200 grams of ice-water, raise the pH to about 8 with a 10 percent by weight aqueous solution of NaOH and extract with benzene. Wash the benzene successively with 10% NaOH, 2% NaCl and then water. Concentrate by evaporation, purify over activated alumina, elute with a 3:3:1 mixture of benzene:ether:ethyl acetate, evaporate and recover the product.

EXAMPLE E 2-anilino-6-diethylamino-3-methoxyfluoran

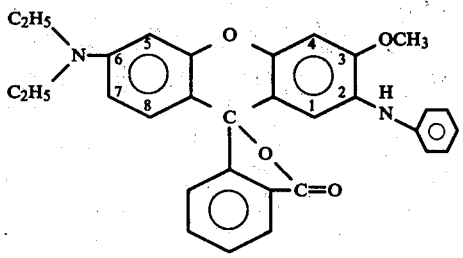

Following the alternate procedure described in Example D but using 4-amino-3-methoxyphenol instead of 4-amino-3-methylphenol, there is obtained the indicated product.

EXAMPLE F 2-(N-benzylamino)-6-N-pyrrolidinylfluoran

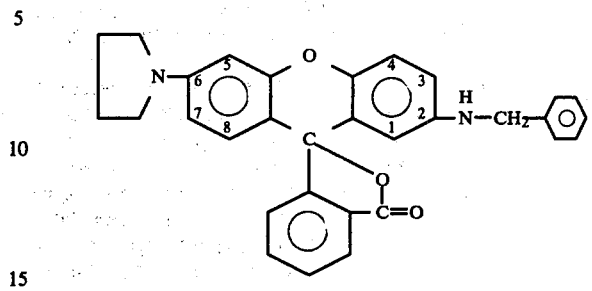

Stir a mixture of 77.75 grams of 2'-carboxy-2-hydroxy-4-N-pyrrolidinylbenzophenone 75.6 grams N-benzyl-p-anisidine and 250 ml of 98% $H_2SO_4$ at 60° C. for 5 hours and then quench into 2,750 ml. ice water. Filter the solid, wash with water and add the solid to a mixture of 500 ml. water, 250 ml. methanol and 26.8 grams NaOH at 70° C. Boil this mixture for 2 hours and cool to 85° C. Filter the solid product, wash with hot water, recrystallize from methanol/acetone and dry. The starting benzophenone compound can be prepared by heating a mixture of 74 grams phthalic anhydride 81.5 grams 1-(3'-hydroxyphenyl) pyrrolidine and 335 ml. xylene for 6 hours at 125° C. Cool to 25° C., filter the precipitate, wash with methanol and recrystallize from ethanol.

EXAMPLE G 2,6-di-(N-pyrrolidinyl) fluoran

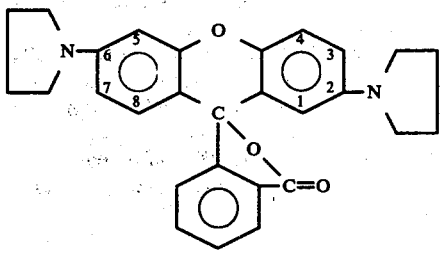

Following the procedure of Example F, but condensing the 2'-carboxy-2-hydroxy-4-N-pyrrolidinylbenzophenone with 1-(4'-hydroxyphenyl) pyrrolidine, instead of N-benzyl-p-anisidine, there is obtained the indicated product.

EXAMPLE H 2-methyl-4-amino-6-diethylaminofluoran

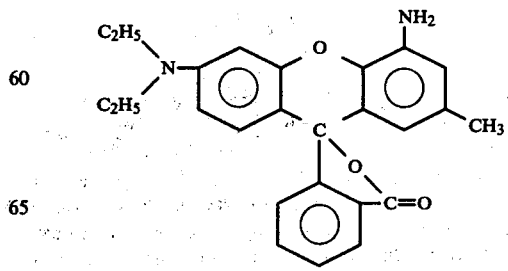

React 2'-carboxy-2-hydroxy-4-diethylamino benzophenone with 4-methyl-2-nitrophenol according to the procedure of Example A and then reduce the product by suspending one part by weight of product in a solution of 2.5 parts by weight of stannous chloride, 2 parts by weight of HCl having a specific gravity of 1.15 and about 0.6 parts by weight of water; warm and stir the suspension until a solution forms. Cool the solution to room temperature, dilute with about 2 parts by weight of water and raise the pH to about 12 with a 10 weight percent aqueous NaOH solution. Recover and purify the precipitate by washing, extraction and recrystallization, as indicated in the previous examples.

EXAMPLE 1

Fluoran colorformers are evaluated with respect to phototropic capacity in the following composition:

|  | Parts by wt. |  |
|---|---|---|
| Acryloid A-101[a] | 60.3 | (solids basis) |
| Trimethylolpropane triacrylate | 19.6 |  |
| Tetraethylene glycol diacrylate | 9.8 |  |
| Benzophenone | 3.4 |  |
| 2,2'-methylene bis (4-ethyl-6-t-butyl) phenol | .18 |  |
| Modaflow[b] | .15 |  |

| -continued |  |
|---|---|
|  | Parts by wt. |
| Tricresyl phosphate | 4.31 |
| 4,4'-bis (dimethylamino)benzophenone | 0.45 |
| Tribromoacetamide | 1.51 |
| Fluoran | 0.3 |
|  | 100.0 |
| Methyl ethyl ketone | 195 |

[a] an acrylic ester polymer in organic solvent from Rohm & Haas Company.
[b] a hydrocarbon flow control agent from Monsanto Chemical Co.

The composition is coated onto a 1-mil thick polyester film and dried in air. The dry thickness of the photosensitive composition is 1–2 mils. The dried layer is covered with a 1-mil thick polyethylene film.

The phototropic capacity is determined visually by removing the polyethylene film, laminating the photopolymerzable composition to a copper-clad panel, placing a light mask over the assembly and exposing this combination to a mercury vapor lamp for 30 seconds. The image is read immediately. Zero means no image, a negative rating indicates the dye system is photofugitive (i.e., fades) while a positive rating indicates the system has darkened in response to the light and is phototropic.

The fluoran compound, color and phototropic capacity are indicated below:

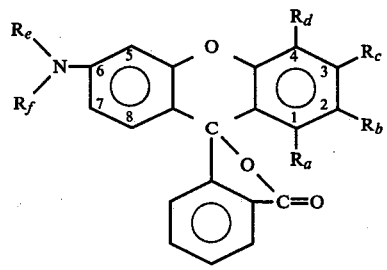

| $R_a$ | $R_b$ | $R_c$ | $R_d$ | $R_e$ | $R_f$ | Developed Color | Phototropic Capacity |
|---|---|---|---|---|---|---|---|
| H | −N(CH₃)(CH₂COC₂H₅) | H | H | C₂H₅ | C₂H₅ | Green | + |
| H | −N(H)(2-CH₃,4-CH₃-phenyl with NH₂) | CH₃ | H | C₂H₅ | C₂H₅ | Purple-black | + |
| H | −N(H)(phenyl-NH₂) | H | H | C₂H₅ | C₂H₅ | Black | + |
| H | −N(CH₂-phenyl)(CH₂-phenyl) | H | H | C₂H₅ | C₂H₅ | Dark Green | + |
| H | −N(H)(phenyl) | H | H | C₂H₅ | C₂H₅ | Black | + |

-continued

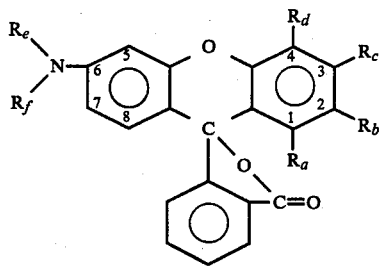

| $R_a$ | $R_b$ | $R_c$ | $R_d$ | $R_e$ | $R_f$ | Developed Color | Phototropic Capacity |
|---|---|---|---|---|---|---|---|
| H | —N(piperidino) | H | H | $C_2H_5$ | $C_2H_5$ | Green | + |
| H | —NH—C₆H₄(COOCH₃) | H | H | $C_2H_5$ | $C_2H_5$ | Black | + |
| H | —NH—C₆H₅ | $CH_3$ | H | $C_2H_5$ | $C_2H_5$ | Black | + |
| H | —N(CH₂C₆H₅)₂ | H | H | piperidino | | Green | + |
| H | $CH_3$ | H | $NH_2$ | $C_2H_5$ | $C_2H_5$ | Orange | + |
| H | —$NH_2$ | $CH_3$ | H | $C_2H_5$ | $C_2H_5$ | Purple | + |
| H | —NH—C₆H₅ | $OCH_3$ | H | $C_2H_5$ | $C_2H_5$ | Black | + |
| H | Cl | $CH_3$ | H | $C_2H_5$ | $C_2H_5$ | Red | + |
| H | H | Cl | H | H | C₆H₁₁ | Yellow-Orange | + |
| C₆H₅ | | H | H | $C_2H_5$ | $C_2H_5$ | Pink | + |
| C₆H₄—N(C₂H₅)₂ | | H | H | $C_2H_5$ | $C_2H_5$ | Blue | + |
| H | —N(piperidino) | H | H | piperidino | | Green | + |
| H | —NH—C₆H₅ | H | H | piperidino | | Black | + |
| H | —S—CH₃ | H | H | $C_2H_5$ | $C_2H_5$ | Red | + |
| Crystal Violet Lactone* | | | | | | — | very weak image using |

-continued

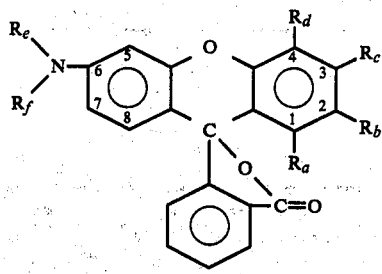

| $R_a$ | $R_b$ | $R_c$ | $R_d$ | $R_e$ | $R_f$ | Developed Color | Phototropic Capacity |
|---|---|---|---|---|---|---|---|
| | | | | | | | 5 grams |

*Crystal Violet Lactone has the structure:

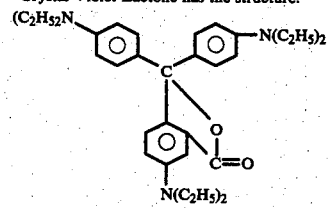

When crystal violet lactone was evaluated and found not to provide a perceptible image, the result was totally surprising, particularly in view of the structural similarity between it and the fluoran compounds described.

EXAMPLE 2

A photoresist composition useful to evaluate various combinations of fluoran coloroformers and halogenated compounds is prepared from the following ingredients:

| | Parts by wt. |
|---|---|
| poly(methyl methacrylate)[1] | 60.0 |
| pentaerythritol triacrylate | 32.0 |
| benzophenone | 3.2 |
| 2,2'-methylene-bis-(4-ethyl-6-t-butylphenol) | .9 |
| Fluoran colorformer | .9 |
| Halogen containing compound | 2.2 |
| 4,4'-bis(dimethylamino)benzophenone | .8 |
| methyl ethyl ketone | 150.0 |

[1] a medium molecular weight product available from E. I. duPont de Nemours & Co., Inc., Wilmington, Delaware under the trademark Elvacite 2010.

The composition is made by dissolving the methyl methacrylate polymer in the solvent, using conventional equipment at low to medium speeds, then adding the monomer and then adding the remaining ingredients.

The solution is coated onto a 1 mil thick polyester film and dried in air. The dry thickness of the sensitized layer is 1–2 mils. The dried layer is covered with a 1 mil thick polyethylene film.

The following table indicates the phototropic capacity of four representative fluoran colorformers in the presence of a variety of halogenated compounds; phototropic capacity is determined as described in Example 1.

A = 2-anilino-3-methoxy-6-diethylaminofluoran
B = 2-anilino-6-diethylaminofluoran
C = 2-piperidino-6-diethylaminofluoran
D = 2-(N,N-dibenzylamino)-6-pyrrolidinofluoran

| Halogenated Compound | A | B | C | D |
|---|---|---|---|---|
| carbon tetrachloride | + | + | + | + |
| carbon tetrabromide | + | + | + | + |
| iodoform | + | + | + | + |
| tris(2,3-dibromopropyl)phosphate | + | + | + | + |
| poly(dibromopropyl acrylate) | + | + | + | + |
| tetrabromobisphenol | + | + | + | + |
| methyl methacrylate/dibromoproply acrylate copolymer | + | + | + | + |
| Chlorowax 70 | + | + | + | + |
| 2,5-dichloro-p-xylene | + | + | + | + |
| 2,3-dibromopropanol | + | + | + | + |
| trichlorocetamide | + | + | + | + |
| iodoacetamide | + | + | + | + |
| dibromoacetamide | + | + | + | + |
| 3-bromopropionamide | + | + | + | + |
| dibromomalonamide | + | + | + | + |
| 2-bromobutyramide | + | + | + | + |
| iodomolonamide | + | + | + | + |
| ethyl iodide | + | + | + | + |
| hexachloroethane | + | + | + | + |
| 1,2,3,4-tetrabromobutane | + | + | + | + |
| 1,1,1-trichloro-2-propanol | + | + | + | + |
| 1,1,1-trichloro-2-methyl-2-propanol | + | + | + | + |
| tribromo-t-butyl alcohol | + | + | + | + |
| 2,2,2-trichloroethanol | + | + | + | + |
| hexachlorocyclopentadiene | + | + | + | + |
| tetrabromocyclohexanone | + | + | + | + |
| hexabromoacetone | + | + | + | + |
| 1,1,1-trichloroacetone | + | + | + | + |
| ethyl trichloroacetate | + | + | + | + |
| dimethyl dibromomalonate | + | + | + | + |
| trichloroethyl trichloroacetate | + | + | + | + |
| isooctyl trichloroacetate | + | + | + | + |
| isotrideryl trichloroacetate | + | + | + | + |
| trichloroethyl phosphate | + | + | + | + |
| N-chlorosuccinimide | + | + | + | + |
| 1,1,1-trichloro-2,2-bis-(p-chlorophenyl)ethane | + | + | + | + |
| 2-methyl-2',4'-dichlorophenoxy ethanol | + | + | + | + |
| 2,3,4,5-tetraiodopyrrole | + | + | + | + |
| hexabromobenzene | + | + | + | + |
| hexabromobiphenyl | + | + | + | + |
| tetrabromobisphenol A | + | + | + | + |
| p-trichloroacetyl-t-butylbenzene | + | + | + | + |

EXAMPLE 3

When the procedure of Example 2 is repeated using fluoran compounds A, B, C and D and tribromoacetamide, dibromomalonamide, iodoform and tetrabromocyclohexanone as the halogenated compound with a variety of amines as hydrogen donors, the systems display phototropic capacity:

|  | HALOGEN | | | | | | | | | | | | | | | |
|---|---|---|---|---|---|---|---|---|---|---|---|---|---|---|---|---|
|  | I | | | | II | | | | III | | | | IV | | | |
|  | Fluoran | | | | | | | | | | | | | | | |
|  | A | B | C | D | A | B | C | D | A | B | C | D | A | B | C | D |
| propylamine | + | + | + | + | + | + | + | + | + | + | + | + | + | + | + | + |
| diisopropanolamine | + | + | + | + | + | + | + | + | + | + | + | + | + | + | + | + |
| triethylamine | + | + | + | + | + | + | + | + | + | + | + | + | + | + | + | + |
| dimethylethanolamine | + | + | + | + | + | + | + | + | + | + | + | + | + | + | + | + |
| N,N-dimethyl butylamine | + | + | + | + | + | + | + | + | + | + | + | + | + | + | + | + |
| p-acetylphenyl dimethylamine | + | + | + | + | + | + | + | + | + | + | + | + | + | + | + | + |
| p-caprylphenyl dimethylamine | + | + | + | + | + | + | + | + | + | + | + | + | + | + | + | + |
| p-dimethylaminophenyl acetate | + | + | + | + | + | + | + | + | + | + | + | + | + | + | + | + |
| p-dimethylaminophenyl valerate | + | + | + | + | + | + | + | + | + | + | + | + | + | + | + | + |
| ethyl dimethylaminobenzoate | + | + | + | + | + | + | + | + | + | + | + | + | + | + | + | + |
| amyl dimethylaminobenzoate | + | + | + | + | + | + | + | + | + | + | + | + | + | + | + | + |
| p-dimethylamino acetophenone | + | + | + | + | + | + | + | + | + | + | + | + | + | + | + | + |
| 4-dimethylamino benzophenone | + | + | + | + | + | + | + | + | + | + | + | + | + | + | + | + |
| 4,4'-bis-(dimethylamino)-bnezophenone | + | + | + | + | + | + | + | + | + | + | + | + | + | + | + | + |
| 2,4-dichlorobenzenediazonium tetrachloroferrite (III) | + | + | + | + | + | + | + | + | + | + | + | + | + | + | + | + |

I = Tribromoacetamide  II = dibromomalonamide
III = iodoform
IV = tetrabromocyclohexanone

EXAMPLE 4

Combinations of photoinitiators and amines can be evaluated using the following composition and the procedures described in Examples 2 and 3.

|  | Parts by wt. |
|---|---|
| poly(methyl methacrylate)[1] | 60.0 |
| pentaerythritol triacrylate | 30.0 |
| photoinitiator | 3.2 |
| 2,2'-methylene-bis-(4-ethyl-6-t-butylphenol) | .9 |
| fluoran colorformer | .9 |
| Tribromoacetamide | 2.2 |
| amine | 2.8 |
| methyl ethyl ketone | 150.0 |

[1]Elvacite 2010 from Du Pont.

The following table indicates phototropic capacity of representative colorforms A and B of Example 2 with a variety of photoinitiators and amines.

| Photoinitiator |
|---|
| 1 benzoin |
| 2 benzoin isobutyl ether |
| 3 thioxanthone |
| 4 2-chlorothioxanthone |
| 5 fluorenone |
| 6 benzil |
| 7 acetophenone |
| 8 benzophenone |
| 9 diethoxyacetophenone |

| Photoinitiator | 1 | 2 | 3 | 4 | 5 | 6 | 7 | 8 | 9 |
|---|---|---|---|---|---|---|---|---|---|
| Colorformer | A B | A B | A B | A B | A B | A B | A B | A B | A B |
| dimethylethanolamine | ++ | ++ | ++ | ++ | ++ | ++ | ++ | ++ | ++ |
| N,N-dimethyl butylamine | ++ | ++ | ++ | ++ | ++ | ++ | ++ | ++ | ++ |
| p-acetylphenyl dimethylamine | ++ | ++ | ++ | ++ | ++ | ++ | ++ | ++ | ++ |
| p-caprylylphenyl dimethylamine | ++ | ++ | ++ | ++ | ++ | ++ | ++ | ++ | ++ |
| p-dimethylaminophenyl acetate | ++ | ++ | ++ | ++ | ++ | ++ | ++ | ++ | ++ |
| p-dimethylaminophenyl valerate | ++ | ++ | ++ | ++ | ++ | ++ | ++ | ++ | ++ |
| ethyl dimethylamino benzoate | ++ | ++ | ++ | ++ | ++ | ++ | ++ | ++ | ++ |
| amyl dimethylamino benzoate | ++ | ++ | ++ | ++ | ++ | ++ | ++ | ++ | ++ |
| p-dimethylamino acetophenone | ++ | ++ | ++ | ++ | ++ | ++ | ++ | ++ | ++ |
| 4-dimethylamino benzophenone | ++ | ++ | ++ | ++ | ++ | ++ | ++ | ++ | ++ |
| 4,4'-bis(dimethylamino) benzophenone | ++ | ++ | ++ | ++ | ++ | ++ | ++ | ++ | ++ |

EXAMPLE 5

The following solution is coated onto a 1 mil thick polyester film to provide a dry thickness of about 0.001 inch, and dried in air. The dried film is covered with a 1 mil thick polyethylene film.

| Ingredients | Parts by wt. |
|---|---|
| copolymer of 76% styrene and 25% methacrylic acid; viscosity of a 40% solution in MEK is 10,360 cps | 57.0 |
| trimethylolpropane triacrylate | 24.0 |
| tetraethyleneglycol diacrylate | 12.2 |
| benzophenone | 4.0 |
| 4,4'-bis-(dimethylamino)-benzophenone | 0.6 |
| 2-anilino-3-methoxy-6-diethylaminofluoran | 0.3 |
| trichloroacetamide | 1.5 |
| benzotriazole | .4 |
| methyl ethyl ketone | 160.0 |

A piece of copper clad, epoxy-fiberglass board is cleaned by scouring with an abrasive cleaner, swabbing and thoroughly rinsing in water. It is given a 20 second dip in dilute hydrochloric acid solution (2 volumes water plus 1 volume concentrated hydrochloric acid), a second rinse with water and then dried with air jets.

The polyethylene cover film is removed from a section of the sandwiched photoresist dry film described above. The bared resist coating with its polyester support is laminated to the clean copper with the surface of the photoresist in contact with the copper surface. The lamination is carried out with the aid of rubber covered rollers operating at 250° F. (121° C.) with a pressure of 3 pounds per lineal inch at the nip at a rate of 2 feet per minute. The resulting sensitized copper clad board protected as it is by the polyester film can be held for later use if desired. Exposure to light is had through a high contrast transparency image in which the conducting pattern appears as transparent areas on an opaque background. Exposure is carried out by placing the sensitized copper clad board (with polyester film still intact) and the transparency into a photographic printing frame. Exposure is maintained for a period of 90 seconds to a 400 watt, 50 ampere vapor lamp at a distance of 12 inches. It is seen that the areas of the resist that have been exposed to light have darkened in color considerably, to a black color which contrasts substantially with the unexposed portions of the resist. The polyethylene terephthalate support film is peeled off and the exposed resist layer developed by agitating the board in a tray containing 2% trisodium phosphate in water for 2 minutes followed by a water rinse. The resulting board which contained a deeply colored resist pattern of the clear areas of the exposing transparency is then etched in ferric chloride solution, rinsed and dried. The resist is removed from the remaining copper by dipping for 2 minutes in a 3% solution of sodium hydroxide in water at 70° C. The result is a high quality printed circuit board.

In an alternative embodiment, the surface of the exposed copper obtained after developing is further cleaned by dipping the board into a 20% ammonium persulfate bath for 30 seconds, washing copiously with water, dipping for 30 seconds in a 20% solution of hydrochloric acid in water, rinsing with water, then drying the board with jets of air. This cleaned board is then plated for 45 minutes at 30 amperes per square foot in a copper pyrophosphate plating bath at 55° C.

EXAMPLE 6

A copper clad piece of epoxy-fiberglass board is cleaned as described in Example 5 above. The cleaned, dried board was sensitized by flowing the following solution over the surface of the board:

| Ingredients | Parts by wt. |
|---|---|
| Copolymer of 37% styrene and 63% monobutyl maleate, average mol. wt. 20,000, viscosity of 10% aqueous solution of ammonium salt = 150 cps. | 60.0 |
| Pentaerythritol tetraacrylate | 34.2 |
| Benzophenone | 2.5 |
| 4,4'-(dimethylamino)-benzophenone | 0.3 |
| Benzotriazole | 0.2 |
| 2,2'methylene-bis-(4-ethyl-6-tert-butylphenol) | 0.9 |
| 2-anilino-3-methoxy-6-diethylaminofluoran | 0.4 |
| Tribromoacetamide | 1.5 |
| Methyl Ethyl Ketone | 150.0 |

The excess solution is drained off the board at room temperature for 2 minutes. The coating is further dried by heating in a forced air oven at 60° C. for 5 minutes. After cooling, the coated board is exposed as described in Example 5 above, and it is seen that where the board is exposed to light, a dark color that dramatically contrasts with the unexposed portions is visible. The resist is developed by agitating the board in a solution of 2% trisodium phosphate in water for one minute, followed by a water rinse. The board is etched in ferric chloride as described in Example 5, and after etching, the exposed resist is stripped from the protected copper by immersing the board in a 3% solution of sodium hydroxide in water at 50° C. for 2 minutes. The result is a high quality printed circuit board.

EXAMPLE 7

Coating compositions are prepared from the following amounts of components:

| Components | Composition, Parts by Wt. | | | | |
|---|---|---|---|---|---|
|  | I | II | III | IV | V |
| PCP[a] | 36.2 | — | — | — | — |
| EPOA[b] | 4.8 | 4.5 | — | — | — |
| E.D.[c] | 16.2 | 57.0 | 54.5 | 59.5 | 47.6 |
| NPGDA[d] | 14.2 | 18.1 | 17.3 | 19.0 | 19.0 |
| EHA[e] | 14.2 | 9.0 | 8.7 | 9.5 | 9.5 |
| DCPA[f] | 9.6 | 6.9 | 15.2 | 7.2 | 19.0 |
| Benzophenone | 4.8 | 4.5 | 4.3 | 4.8 | 4.9 |
| Colorformer[g] | 0.9 | 0.9 | 0.9 | 0.9[h] | 0.9[i] |
| Trichloroacetamide | 1.5 | 1.5 | 1.5 | 1.5 | 1.5 |
| 4,4'-bis(dimethylamino) benzophenone | .5 | .5 | .5 | .5 | .5 |

[a]80% solution of Union Carbide PCP-0300 polycaprolactone/toluene diisocyanate oligomer in 20% hydroxyethyl acrylate
[b]polyacrylate of epoxidized soya bean available fom Union Carbide
[c]Epon Diacrylate
[d]neopentyl glycol diacrylate
[e]2-ethylhexyl acrylate
[f]dicyclopentenyl acrylate
[g]2-anilino-3-methoxy-6-diethylaminofluoran
[h]2-anilino-6 diethylaminofluoran
[i]2-piperidino-6-diethylaminofluoran The compositions are prepared by adding the Epon Diacrylate polymer to the monomers and mixing in conventional equipment at low to medium speeds until dissolved. The photoinitiator is added and the other ingredients are incorporated.

The coatings are applied to a cellulosic substrate (hardboard) by direct roller coating. The wet coated substrate is then exposed to UV radiation by being placed on a chain link conveyor and passed under a 200 watt/lineal inch Hanovia quartz ultraviolet lamp at a distance of about two inches at a speed of approximately 12 feet per minute.

Tough, resistant, deeply colored coatings are obtained.

EXAMPLE 8

An ink composition is prepared as follows by mixing together the following components in conventional manner.

| Epoxy Acrylate | 60.0 |
|---|---|
| Ultraflex Microcrystalline Wax | 3.3 |
| Pentaerythritol Tetraacrylate | 29.2 |
| Benzophenone | 4.5 |
| 4,4'-bis(dimethylamino)benzophenone | .50 |
| 2-anilino-3-methoxy-6-diethylaminofluoran | 1.0 |
| Trichloroacetamide | 1.50 |

When this ink is silk screened onto a paper substrate and exposed to light using a 200 watt/linear inch medium pressure mercury vapor lamp at a distance of 4 inches for about 5 seconds, there is obtained a dry, tack-free dark-printed substrate having good gloss and adhesion.

When the colorformer is replaced by the colorformers described in Example 1, there is obtained an ink that cures to a dry, tack-free, deeply colored product.

EXAMPLE 9

An acrylated urethane modified polyester can be prepared as follows:

To a reaction vessel equipped with stirrer, reflux condenser, thermometer and heating means charge

|  | Parts by weight |
|---|---|
| 1,3-butylene glycol | 12.68 |
| 1,6-hexanediol | 66.64 |
| Adipic acid | 20.58 |
| Dibutyl Tin Oxide | .10 | using a nitrogen sparge. Heat to a reflux and react to an acid value less than 3. The product will have an equivalent weight of about 501 and a molecular weight of about 1000.

To a reaction vessel equipped with a stirrer, thermometer and nitrogen sparge charge 15.22 parts by weight of 2,4-tolylene diisocyanate and heat to 50° C. Add a mixture of 10.13 parts by weight of 2-ethylhexyl acrylate and 0.0035 parts by weight of phenothiazine over a two hour period, maintaining the temperature at 60° C. during this period. Hold at 60° C. for an additional three hours. Cool to 50° C. and add 43.83 parts by weight of the polyester previously prepared over a one hour period, maintaining the temperature at 60° C.; thereafter hold the temperature at 70° C. for 3 hours. Cool to 60° C.; add 0.35 parts by weight of methanol to obtain zero free isocyanate and hold an additional ½ hour at 60° C. Cool and store the product.

A. A UV curable composition can be prepared having the following composition:

|  | Parts by Weight |
|---|---|
| Acrylated polyester | 66.6 |
| 1,6-hexanediol diacrylate | 14.5 |
| Pentaerythritol triacrylate | 4.6 |
| Methyl ethyl ketone | 1.9 |
| 2-ethylhexyl acrylate | 4.7 |
| Tribromoacetamide | 2.0 |
| Benzophenone | 3.0 |
| 2-anilino-3-methoxy-6-diethyl-aminofluoran | .7 |
| dimethylamino ethanol | 2.0 |

The composition is mixed until homogeneous. The photopolymerizable composition is applied to a wooden test piece, having a smooth surface, at the rate of 100 grams per square meter and the coated surface is covered with a 30 mm. thick untreated polyethylene film exercising care to ensure that no air bubbles are entrained. This is then exposed to actinic rays with a 2-KW high pressure mercury-vapor lamp for 30 seconds at a radiation distance of 30 mm. When the polyethylene film is stripped, it is seen that a smooth cured coating is obtained having good hardness, good adhesion to the wood and that is black in color.

B. A second UV-curable system can be prepared having the following composition:

|  | Parts by Weight |
|---|---|
| Acrylated polyester | 65.3 |
| Pentaerythritol tetrakis (β-mercaptopropionate) | 26.0 |
| Benzophenone | 3.0 |
| 2-anilino-3-methoxy-6-diethylaminofluoran | .7 |
| dimethylaminoethanol | 3.0 |
| Tribromoacetamide | 2.0 |

When coated on a wood test specimen and treated as in part A above, there is obtained a cured coating having a black color.

EXAMPLE 10

A UV curable epoxide composition can be prepared having the following composition:

|  | Parts by Weight |
|---|---|
| Diglycidyl ether of bisphenol A | 212 |
| (3,4-epoxycyclohexyl)-methyl 3,4-epoxycyclohexane carboxylate | 106 |
| dodecyl glycidyl ether | 32 |
| Propylene Carbonate[1] | 4.8 |
| β-chlorobenzenediazonium hexafluorophosphate | 3.5 |
| N,N-dimethylacetamide | .16 |
| 2-anilino-3-methoxy-6-diethyl-aminofluoran | 2.5 |

[1]A cyclic propylene ester of carbonic acid identified as 4-methyl-1,3-dioxolan-2-one.

Mix the propylene carbonate, diazonium halide and acetamide and stir into a homogeneous mixture of epoxide and dyestuff.

When this composition is coated on a wood test piece and exposed to UV radiation as in Example 9, but without the cover sheet, there is obtained a cured coating having a black color.

What is claimed is:

1. A stable phototropic photosensitive composition which comprises:
   a. at least one component capable of curing, crosslinking or polymerizing upon suitable initiation,
   b. an initiator for said component that is potentiated by actinic radiation,
   c. a fluoran colorformer compound capable of becoming more intensely colored upon contact with a color activator, said fluoran compound having the structural formula

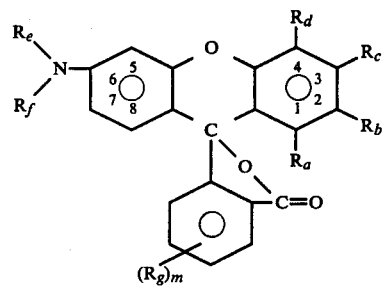

where
   $R_a$ is hydrogen or an aliphatic group of one to 12 carbon atoms that is unsubstituted or optionally substituted and that may be interrupted by $$-\overset{H}{\underset{|}{N}}-\text{ or }-O-$$

and that is bound directly via carbon or oxygen;

$R_b$ is an amino group where one or both hydrogen atoms are optionally replaced by unsubstituted or substituted aliphatic groups, cycloaliphatic groups, aromatic groups or mixed aliphatic-aromatic groups or $R_b$ is a heterocyclic group of 3 to 12 ring members bound via a ring nitrogen and containing in addition to nitrogen, one or more of oxygen and sulfur as hetero ring members or $R_a$ and $R_b$ together form a condensed aromatic nucleus;

$R_c$ is hydrogen, halogen, an aliphatic group of one to 12 carbon atoms that is unsubstituted or substituted and that may be interrupted by nitrogen or oxygen and that is bound directly via carbon or oxygen, or $R_c$ is an amino group where one or both hydrogen atoms are optionally replaced by unsubstituted or substituted aliphatic groups, cycloaliphatic groups, aromatic groups, mixed aliphatic-aromatic groups or where $R_c$ is a heterocyclic group with three to twelve ring members containing one or more of nitrogen, oxygen and sulfur as hetero ring members or $R_c$ is an aromatic group that is unsubstituted or optionally substituted or a mixed aliphatic-aromatic group or an aromatic ether or aliphatic-aromatic ether group;

$R_d$ is hydrogen, lower aliphatic or an amino group where one or both hydrogen atoms are optionally replaced by unsubstituted or substituted aliphatic groups, cycloaliphatic groups, aromatic groups, mixed aliphatic-aromatic groups or $R_d$ is a heterocyclic group of 3 to 12 ring members containing one or more of nitrogen, oxygen and sulfur as hetero ring members;

$R_e$ and $R_f$ each independently is hydrogen, unsubstituted or substituted aliphatic of one to 12 carbon atoms which may be interrupted by oxygen or nitrogen, and which is be bound directly via carbon, cycloaliphatic groups, aromatic groups, mixed aliphatic-aromatic groups, or $R_e$ and $R_f$, together with the nitrogen atom form a heterocyclic group of 3 to 12 ring members, optionally containing, in addition to nitrogen, one or more of sulfur and oxygen as hetero ring members;

$(R_g)_m$ represents one to 3, independently, of hydrogen, lower aliphatic bound directly via carbon or oxygen, or is halogen, acetamido or optionally substituted amino and provided that at least one of $R_b$, $R_c$ and $R_d$ is an amino group, as defined, and d. a latent activator for the fluoran color-former that is capable of activating the fluoran compound under the influence of actinic light and is capable of generating or facilitating the production of an acidic substance which can react with said fluoran compound to activate a color change.

2. A composition according to claim 1 in which the fluoran compound is a 2-amino fluoran.

3. A composition according to claim 1 in which the fluoran compound is a 2-amino fluoran of formula:

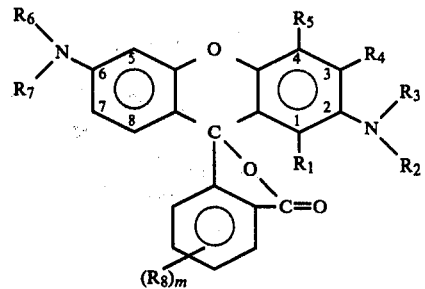

where $R_1$ is hydrogen, halogen, alkyl of one to 12 carbon atoms, alkoxy of one to 12 carbon atoms $R_2$ and $R_3$ each independently is hydrogen, alkyl of one to 12 carbon atoms, alkenyl of 2 to 12 carbon atoms alkoxyalkyl of 2 to 8 carbon atoms, alkoxycarbonylalkyl of 3 to 9 carbon atoms, cycloalkyl of 5 or 6 carbon atoms, acyl of one to 12 carbon atoms, phenyl, naphthyl or benzyl that are unsubstituted or substituted in the aromatic nucleus by one to 3 of amino, mono- or di-alkyl amino of one to 5 carbon atoms, alkyl of one to 7 carbon atoms, alkoxy of one to 7 carbon atoms, carboxyl, alkoxycarbonyl of 2 to 7 carbon atoms, acyl or acylamino of one to 5 carbon atoms, or $MeSO_3$—where Me is alkali metal or $R_2$ and $R_3$ together with the associated nitrogen atom form a heterocyclic radical of 3 to 12 ring members selected from pyrrolidinyl, piperidyl, pipecolinyl, perhydroazepinyl, heptamethyleneimino, octamethyleneimino, indolinyl, 1,2,3,4-tetrahydroquinolinyl, hexahydrocarbazolyl, morpholinyl, thiomorpholinyl, piperazinyl, N-alkylpiperazinyl where the alkyl group contains one to 4 carbon atoms, pyrazolinyl, or 3-methylpyrazolinyl $R_4$ is hydrogen, alkyl of one to 12 carbon atoms, alkoxy of one to 12 carbon atoms, halogen, amino that is unsubstituted or substituted by one or two of the substituents as defined for $R_2$ and $R_3$, or $R_4$ is phenyl, phenoxy, benzyl or benzyloxy that is unsubstituted or substituted in the aromatic nucleus by one to 3 of amino, mono- or di-alkyl amino of one to 5 carbon atoms, lower alkyl, lower alkoxy, carboxyl, alkoxycarbonyl of 2 to 7 carbon atoms, acyl of one to 5 carbon atoms or $MeSO_3$—where Me is alkali metal $R_5$ is hydrogen, lower alkyl, lower alkoxy or amino that is unsubstituted or substituted by one or two of the substituents as defined for $R_2$ and $R_3$, including the heterocyclic members, $R_6$ and $R_7$, each independently is selected from the same group as defined for $R_2$ and $R_3$, including the heterocyclic members thereof;

$(R_8)_m$ represents one to 3 members independently selected from hydrogen, alkyl of one to 7 carbon atoms, alkoxy of one to 7 carbon atoms, halogen, acetamido, amino or mono- or di-alkyl amino of one to 7 carbon atoms.

4. A composition according to claim 1 in which the fluoran compound is a 2,6-diamino fluoran.

5. A composition according to claim 3 in which the fluoran compound is a 2,6-diamino fluoran of formula:

where R₂, R₃, R₄, R₆ and R₇ are all as previously defined.

6. A composition according to claim 5 in which
R₂ is hydrogen, alkyl of one to 7 carbon atoms or acyl of one to 7 carbon atoms
R₃ is hydrogen, alkyl of one to 7 carbon atoms, acyl of one to 7 carbon atoms, phenyl, benzyl or naphthyl
or where R₂ and R₃ together with the associated nitrogen atom form morpholinyl, piperazinyl, pyrrolidinyl or piperidinyl
R₄ is hydrogen, alkyl of one to 7 carbon atoms or alkoxy of one to 7 carbon atoms
R₆ and R₇ is each alkyl of one to 5 carbon atoms or together with the associated nitrogen form morpholinyl, piperazinyl, pyrrolidinyl or piperidinyl.

7. A composition according to claim 1 in which the fluoran compound has the formula:

where
R₃ is hydrogen or phenyl R₄ is hydrogen, (C₁–C₃) alkyl or (C₁–C₃) alkoxy
and R₆ and R₇ is each (C₁–C₃) alkyl.

8. A composition according to claim 1 in which the fluoran compound has the following formula where R₃ is hydrogen or phenyl and R₄ is hydrogen, methyl or methoxy.

9. A composition according to claim 1 in which the component capable of curing crosslinking of polymerizing contains at least one ethylenically unsaturated group of structure $$\diagup_{\diagdown}C=C\diagup^{\diagdown}$$

capable of curing, crosslinking or polymerizing under the influence of free radicals, or at least one epoxide group of structure $$\diagup_{\diagdown}C\underset{\diagdown O \diagup}{—}C\diagup^{\diagdown}$$

capable of curing, crosslinking or polymerizing under the influence of a Lewis acid.

10. A composition according to claim 1 in which the component capable of curing, crosslinking or polymerizing comprises an acrylyl or methacrylyl compound.

11. A composition according to claim 10 in which the acrylyl or methacrylyl compound has the general formula $$CH_2=\overset{M}{\underset{|}{C}}—COOM' \text{ or } (CH_2=\overset{H}{\underset{|}{C}}—COO)_rG;$$

when the compound has the formula $$CH_2=\overset{M}{\underset{|}{C}}—COOM'$$

M is H or CH₃
M' is cycloalkyl of 5 to 12 carbon atoms, cycloalkenyl of 5 to 12 atoms, —C_pH_{2p}M" or (C_qH_{2q}O)_sC_qH_{2q+1};

where
p is an integer from 1 to 10
q is an integer from 2 to 4
s is an integer from 0 to 4
M" is hydrogen, hydroxyl, phenoxy, alkoxy of 1 to 8 carbon atoms;
and where the compound has the formula $$(CH_2=\overset{H}{\underset{|}{C}}—COO)_rG$$

G is a polyvalent alkylene group of formula

—C_xH_{2x-y}— in which
x is an integer from 2 to 8
y is an integer from 0 to 2
or G is a divalent ether or ester group of formula —(C_qH_{2q}O)_tC_qH_{2q}— or —(C_qH_{2q}COO)_tC_qH_{2q}— where
t is an integer from 1 to 5,

12. A composition according to claim 1 in which component a is an acrylyl compound selected from the group consisting of triethyleneglycol diacrylate, tetraethylene glycol diacrylate, pentaerythritol triacrylate, trimethylolpropane triacrylate, and pentaerythritol tetraacrylate.

13. A composition according to claim 1 in which the initiator comprises a photoinitiator.

14. A composition according to claim 13 in which the photoinitiator comprises an aromatic carbonyl compound, a diazonium salt or mixture thereof.

15. A composition according to claim 1 in which the initiator comprises a benzoin ether, benzophenone, an alkylamino benzophenone, a monoaryl ketone, a xanthone, a thioxanthone, a quinone, or a diazonium salt.

16. A composition according to claim 1 in which the latent activator generates a Lewis acid under the influence of actinic light.

17. A composition according to claim 16 in which the latent activator comprises a diazonium salt.

18. A composition according to claim 1 in which the latent activator comprises a proton donor and a halogenated compound.

19. A composition according to claim 18 in which the proton donor comprises a compound of the formula

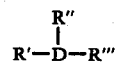

where

D is N, As or P R' and R", each independently is hydrogen, linear or branched alkyl of from 1 to about 12 carbon atoms, linear or branched alkenyl of from 2 to about 12 carbon atoms, cycloalkyl of from 3 to about 10 ring carbon atoms, cycloalkenyl of from 3 to about 10 ring carbon atoms, aryl of from 6 to 12 ring carbon atoms, alkaryl of from 6 to about 12 ring carbon atoms, aralkyl of from 6 to 12 ring carbon atoms, R''' has the same meaning as R' and R" except that it cannot be hydrogen and cannot be aryl when both R' and R" are aryl; the aryl groups can be unsubstituted or substituted by one or more of amino, mono-or di-(lower alkyl) amino loweralkylcarbonyl, loweralkoxycarbonyl, loweralkylcarbonyloxy, phenylcarbonyl or aminophenylenecarbonyl where the amino group is unsubstituted or substituted by lower alkyl, or where R' and R''' together with D form a heterocycle and in such case R" and R''' together are divalent alkylene of 2 to 12 carbon atoms, divalent alkenylene of 3 to 12 carbon atoms, divalent alkatrienylene of from 5 to 10 carbon atoms, divalent alkyleneoxyalkylene having a total of from 4 to 12 carbon atoms or divalent alkyleneaminoalkylene having a total of from 4 to 12 carbon atoms.

20. A composition according to claim 19 where D is nitrogen.

21. A composition according to claim 19 in which the proton donor comprises a p-aminophenyl carbonyl of formula

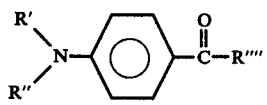

where R' and R" are alkyl of one to 4 carbon atoms and R'''' is alkyl of one to 12 carbon atoms, alkoxy of one to 12 carbon atoms, phenyl, loweralkylaminophenylene or di(loweralkyl) aminophenylene.

22. A composition according to claim 19 in which the proton donor comprises p-(dimethylamino) acetophenone; p-(dimethylamino) propiophenone; p-(dimethylamino)-butyrophenone; p-(dimethylamino)-valerophenone; p-(dimethylamino) myristylphenone; a p-(diloweralkylamino)-benzoic acid ester; 4-dimethylaminobenzophenone; 4-dimethylamino-4'-propylaminobenzophenone; and 4,4'-bis(dimethylamino)benzophenone.

23. A composition according to claim 18 in which the halogenated compound comprises a aromatic, aliphatic, alicyclic or mixed hydrocarbon optionally substituted by oxygen, amine, amide, hydroxyl, nitrile or phosphate and where the hydrocarbyl rings or chains are optionally interrupted by ether, ester, carbonyl or amide.

24. A composition according to claim 18 in which the halogenated compound comprises a halogenated alkane or alkene of one to 8 carbon atoms, a halogenated alkanol of 2 to 8 carbon atoms, a halogenated cycloaliphatic compound of 3 to 9 carbon atoms, halogenated aliphatic carbonylic of 2 to 8 carbon atoms or a halogenated ester or amide of a mono or dicarboxylic acid of 2 to 8 carbon atoms.

25. A composition according to claim 18 in which the halogenated compound comprises a compound of formula

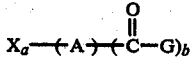

where
X is Cl, Br or I
a is an integer from 0 to 4
A is alkyl or alkenyl of 1 to 7 carbon atoms
G is

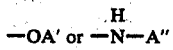

A' is alkyl or haloalkyl of 1 to 15 carbon atoms and halo is Cl, Br or I; A" is hydrogen, alkyl or haloalkyl of 1 to 4 carbon atoms and halo is Cl, Br or I;
b is 1 or 2.

26. A composition according to claim 18 in which the halogenated compound comprises a compound of formula

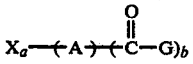

where
X is Cl, Br or I
a is an integer from 1 to 4
A is alkyl of 1 to 4 carbon atoms
G is OA' or

where A' is alkyl or haloalkyl of 1 to 15 carbon atoms and halo is Cl, Br or I;
A' is hydrogen, alkyl or haloalkyl of 1 to 4 carbon atoms and halo is Cl, Br or I;
b is 1 or 2.

27. A composition according to claim 9 in which the component capable of curing, crosslinking or polymerizing upon suitable initiation comprises a 1,2-epoxide.

28. A composition according to claim 1 which comprises:
   a. a 1,2-epoxide,
   b. a diazonium metal halide salt,
   c. a fluoran compound, as defined.

29. A composition according to claim 1 in which
   a. the component capable of curing, crosslinking or polymerizing contains at least one ethylenically unsaturated group of structure

capable of curing, crosslinking or polymerizing under the influence of free radicals,
   b. the initiator is a photoinitiator that releases free radicals under the influence of actinic radiation,
   c. the fluoran compound is as defined,
   d. the latent activator comprises:
      (1) a diazonium metal halide salt, or
      (2) a proton donor and a halogenated compound and combinations thereof.

30. A composition according to claim 29 in which
   a. the component capable of curing, crosslinking or polymerizing is an acrylyl or methacrylyl compound,
   b. the photoinitiator comprises an aromatic carbonyl compound,
   c. the fluoran compound is as defined,
   d. the latent activator comprises a halogenated compound and an amine.

31. A composition according to claim 30 in which
   a. the component capable of curing, crosslinking or polymerizing is an acrylyl or methacrylyl compound,
   b. the photoinitiator comprises a benzoin ether, benzophenone, an alkylamino benzophenone, a monoaryl ketone, a xanthone, a thioxanthone or a quinone,
   c. the latent activator comprises:
      (1) a halogenated mono or dicarboxylic acid of 2 to 8 carbon atoms or the ester or amide thereof, and
      (2) a secondary or tertiary organic amine.

32. A composition according to claim 31 which comprises:
   a. a acrylyl or methacrylyl compound,
   b. a benzoin ether, benzophenone, an alkylamino benzophenone, a monoaryl ketone, a xanthone, a thioxanthone or a quinone,
   c. a fluoran compound,
   d. an activator comprising:
      (1) a halogenated compound of formula

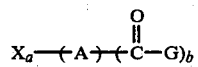

where X is Cl, Br or I
   a is an integer from 0 to 4
   A is alkyl or alkenyl of 1 to 7 carbon atoms
   G is

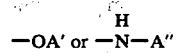

A' is alkyl or haloalkyl of 1 to 15 carbon atoms and halo is Cl, Br or I;
   A" is H, alkyl or haloalkyl of 1 to 4 carbon atoms and halo is Cl, Br or I;
   b is 1 or 2, and
      (2) a p-aminophenyl carbonyl of formula:

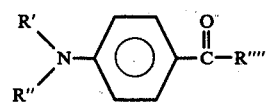

where R' and R" are alkyl of one to 4 carbon atoms and R"" is alkyl of one to 12 carbon atoms, alkoxy of one to 12 carbon atoms, phenyl, loweralkyliminophenylene or di(loweralkyl)-aminophenylene.

33. A composition according to claim 3 which comprises:
   a. an acrylyl or methacrylyl compound,
   b. a benzoin ether, benzophenone, an alkylaminobenzophenone, a monoaryl ketone, a xanthone, a thioxanthone or a quinone,
   c. a fluoran compound,
   d. an activator comprising:
      (1) a halogenated amide or ester of mono or dicarboxylic acid of 2 to 8 carbon atoms, and
      (2) a tertiary amine.

34. A composition according to claim 33 which comprises:
   40 to 70 percent by weight of a preformed polymer binder;
   30 to 50 percent by weight of curable cross-linking or polymerizable component selected from acrylyl and methacrylyl compounds and mixtures thereof;
   1 to 10 percent by weight of photoinitiator selected from benzoin ethers, benzophenone, alkylaminobenzophenones, monoaryl ketones, xanthones, thioxanthones, quinones and mixtures thereof;
   0.01 to 2 percent by weight of fluoran compound;
   0.1 to 5 percent by weight of an amide or ester of a halogenated mono or dicarboxylic acid of 2 to 8 carbon atoms;
   0.1 to 10 percent by weight of a tertiary amine.

35. A composition according to claim 34 in the form of a thin layer.

36. A composition according to claim 34 in the form of an assembly comprising a support sheet, photosensitive composition, one surface of which is adhered to the support sheet, and a transparent sheet adhered to the other surface of the photosensitive composition.

37. A composition according to claim 34 in the form of a thin layer on a support.

38. An article according to claim 37 in which the support is a conductive metal layer.

39. An article according to claim 37 in which the support is non-conductive.

40. A composition according to claim 29 which comprises:
   a. 15 to 70 percent by weight of an ethylenically unsaturated component capable of curing crosslinking or polymerizing under the influence of free radicals
   b. 10 to 50 percent by weight of a preformed polymeric binder or of a compound capable of curing, crosslinking or polymerizing with said ethylenically unsaturated component under the influence of free radicals
   c. 0.1 to 10 percent by weight of a photoinitiator
   d. 0.01 to 2 percent by weight of fluoran compound
   e. 0.1 to 5 percent by weight of halogen compound, and
   f. 0.1 to 10 percent by weight of a tertiary amine.

41. A composition according to claim 3 which comprises:
   a. 15 to 70 percent by weight of an ethylenically unsaturated component capable of curing, crosslinking or polymerizing under the influence of free radicals
   b. 10 to 50 percent by weight of preformed polymeric binder or of a compound capable of curing, crosslinking or polymerizing with said ethylenically unsaturated component under the influence of free radicals
   c. 0.1 to 10 percent by weight of photoinitiator
   d. 0.01 to 2 percent by weight of fluoran compound
   e. 0.1 to 5 percent by weight of a halogen compound
   f. 0.1 to 10 percent by weight of a tertiary amine.

42. A composition according to claim 41 which comprises:
   a. 15 to 70 percent by weight of an acrylyl or methacrylyl compound
   b. 10 to 50 percent by weight of a preformed polymeric binder or of a compound capable of curing, crosslinking or polymerizing with said acrylyl or methacrylyl compound under the influence of free radicals
   c. 0.1 to 10 percent by weight of an aryl carbonyl compound as photoinitiator
   d. 0.01 to 2 percent by weight of fluoran compound
   e. 0.1 to 5 percent by weight of a halogenated mono or dicarboxylic acid of 2 to 8 carbon atoms or the ester or amide thereof
   f. 0.1 to 10 percent by weight of a p-aminophenyl carbonyl compound.

43. A composition according to claim 42 in which the photoinitiator comprises a benzoin ether, benzophenone, an alkylaminobenzophenone, a monoaryl ketone, a xanthone, a thioxanthone or a quinone, the halogenated compound has the formula:

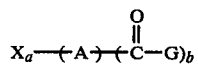

where X is Cl, Br or I
a is an integer from 0 to 4
A is alkyl or alkenyl of 1 to 7 carbon atoms
G is

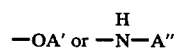

A' is alkyl of haloalkyl of 1 to 15 carbon atoms and halo is Cl, Br or I,
A" is H, alkyl or haloalkyl of 1 to 4 carbon atoms and halo is Cl, Br or I, and
b is 1 or 2,
and the p-aminophenyl carbonyl compound has the formula:

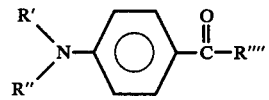

where R' and R" are alkyl of one to 4 carbon atoms and R"" is alkyl of one to 12 carbon atoms, alkoxy of one to 12 carbon atoms, phenyl, loweralkyliminophenylene or di(lower alkyl) aminophenylene.

44. A composition according to claim 43 in the form of a decorative or protective coating or ink.

45. A process which comprises applying the composition of claim 30 to a substrate and thereafter imagewise exposing said composition to actinic radiation.

46. A process which comprises applying the composition of claim 41 to a substrate and thereafter imagewise exposing said composition to actinic radiation.

* * * * *